(12) United States Patent
Yagi et al.

(10) Patent No.: US 10,545,285 B2
(45) Date of Patent: Jan. 28, 2020

(54) HYBRID OPTICAL ASSEMBLY AND METHOD FOR FABRICATING SAME

(71) Applicant: SUMITOMO ELECTRIC INDUSTRIES, LTD., Osaka (JP)

(72) Inventors: Hideki Yagi, Osaka (JP); Naoko Konishi, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/271,327

(22) Filed: Feb. 8, 2019

(65) Prior Publication Data
US 2019/0250328 A1  Aug. 15, 2019

(30) Foreign Application Priority Data
Feb. 14, 2018 (JP) .................. 2018-024202

(51) Int. Cl.
| | |
|---|---|
| G02B 6/12 | (2006.01) |
| G02B 6/132 | (2006.01) |
| H01S 5/22 | (2006.01) |
| G02B 6/13 | (2006.01) |
| G02B 6/136 | (2006.01) |
| H01S 5/343 | (2006.01) |

(52) U.S. Cl.
CPC ......... *G02B 6/12004* (2013.01); *G02B 6/131* (2013.01); *G02B 6/132* (2013.01); *G02B 6/136* (2013.01); *H01S 5/22* (2013.01); *H01S 5/3434* (2013.01)

(58) Field of Classification Search
CPC .... G02B 6/12004; G02B 6/132; G02B 6/131; G02B 6/136; H01S 5/22; H01S 5/3434
See application file for complete search history.

(56) References Cited

U.S. PATENT DOCUMENTS

| | | | |
|---|---|---|---|
| 2003/0016913 A1* | 1/2003 | Brophy .............. | G02B 6/12004 385/42 |
| 2019/0250328 A1* | 8/2019 | Yagi .................. | G02B 6/12004 |

OTHER PUBLICATIONS

Fang, Alexander W., et al., Electrically pumped hybrid AlGaInAs-silicon evanescent laser, *Optics Express*, vol. 14, No. 20, Oct. 2, 2006.

* cited by examiner

*Primary Examiner* — Andrew Jordan
(74) *Attorney, Agent, or Firm* — Smith, Gambrell & Russell, LLP.

(57) ABSTRACT

A hybrid optical assembly includes: a photonic device having a waveguide structure including group IV semiconductor and oxide; and an optical source device including group III-V semiconductor. The source device is bonded to the photonic device. The source device and the waveguide structure are arranged in a direction of a first axis. The source device has a first semiconductor mesa including an upper core layer and a first upper cladding layer and a second semiconductor mesa including a lower core layer and a second upper cladding layer. The first and second semiconductor mesas extend in a direction of a second axis intersecting the first axis. The second semiconductor mesa has a length larger than that of the first semiconductor mesa. The lower core layer, the second upper cladding layer, and the upper core layer and the first upper cladding layer are arranged in the direction of the first axis.

6 Claims, 17 Drawing Sheets

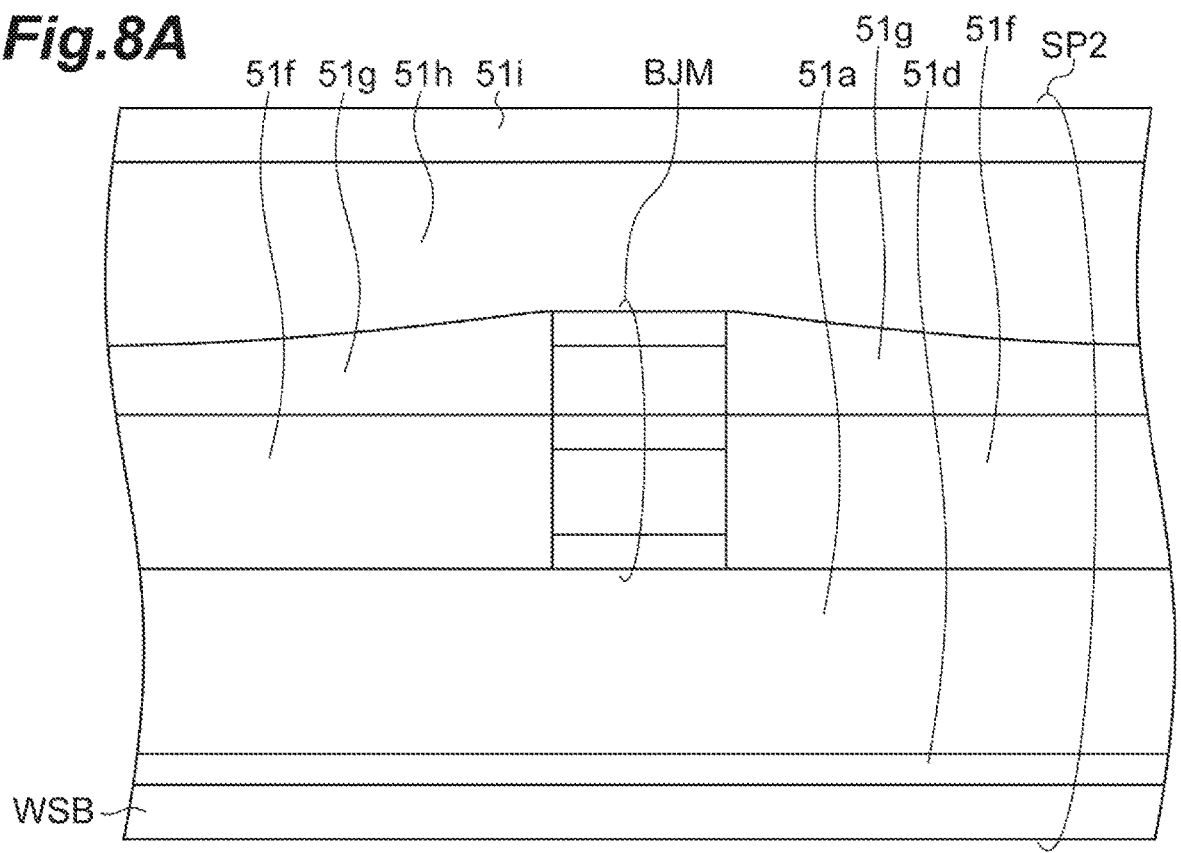
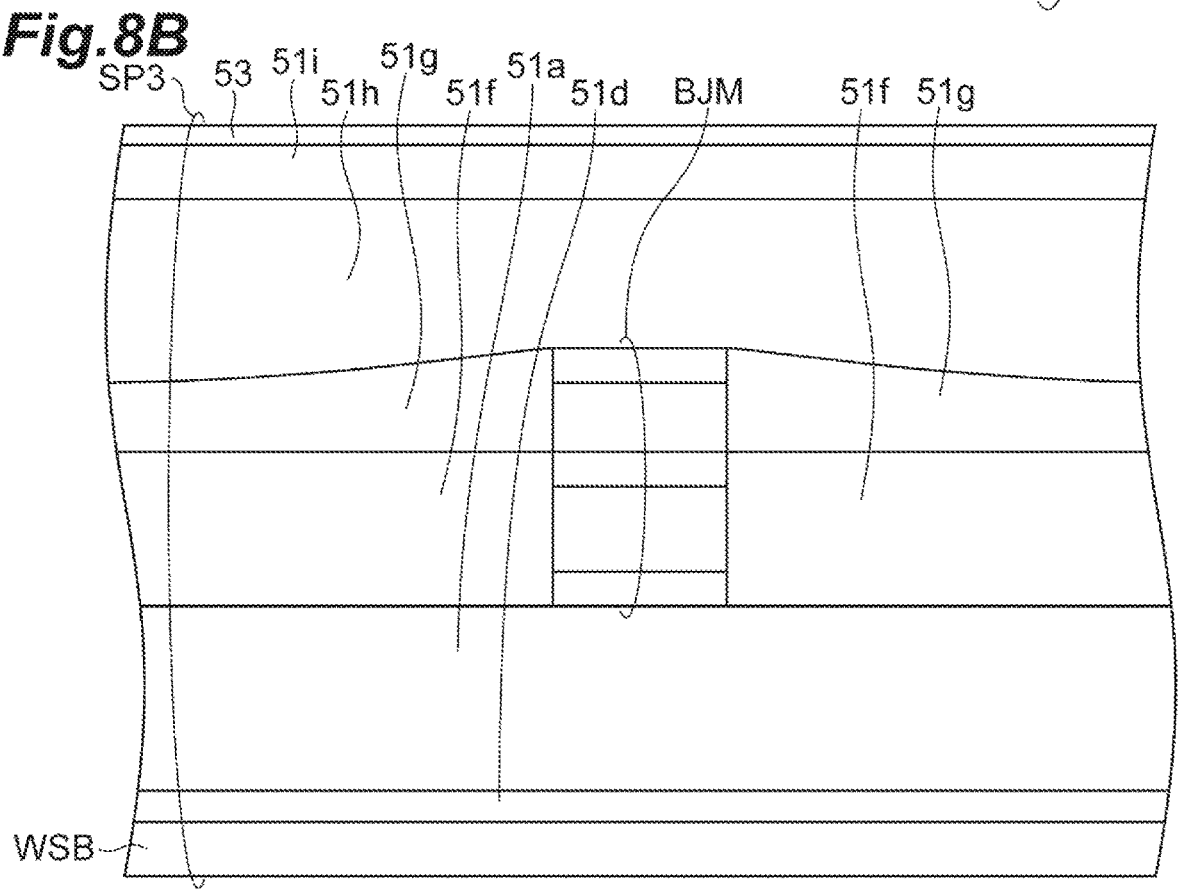

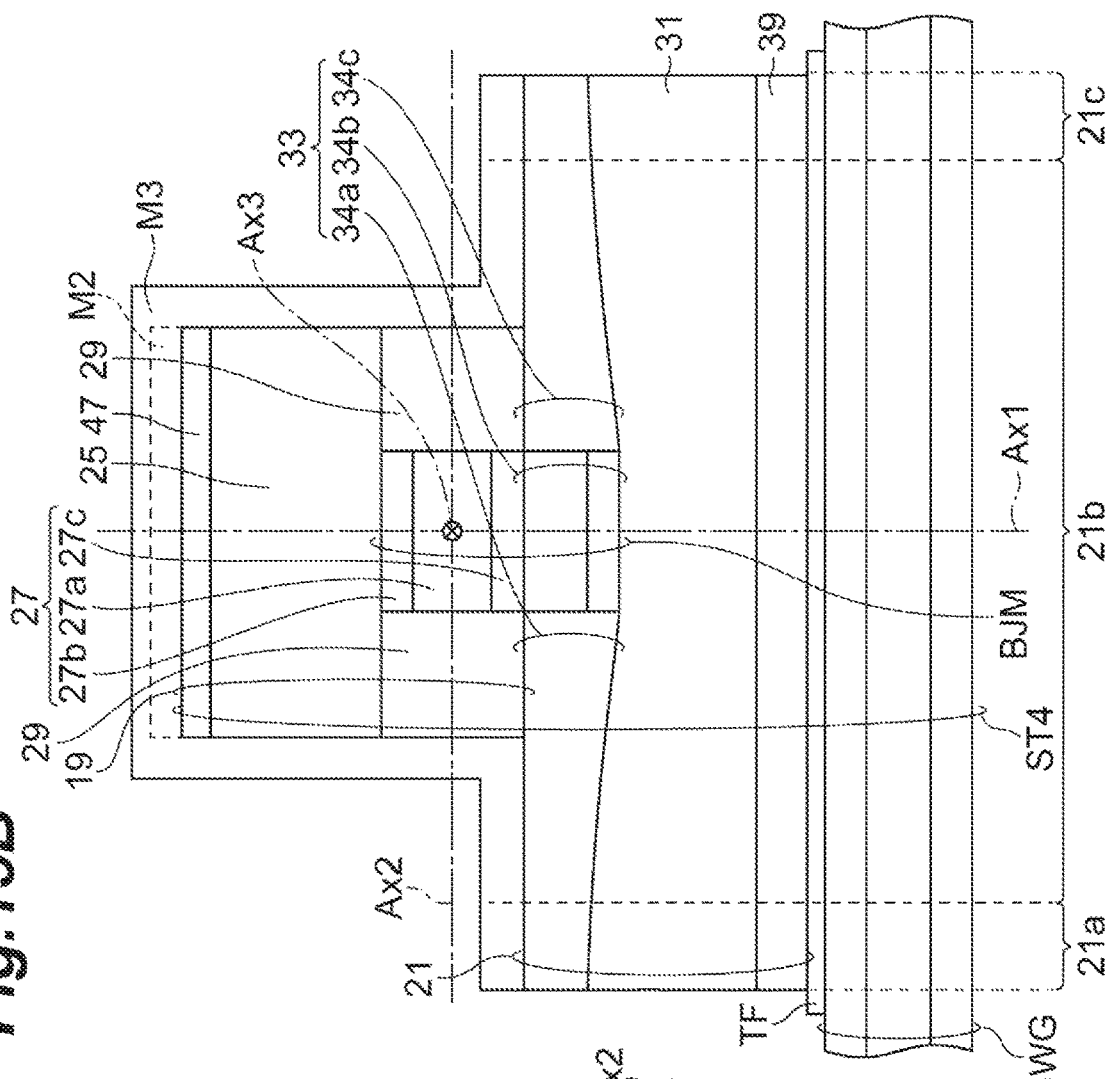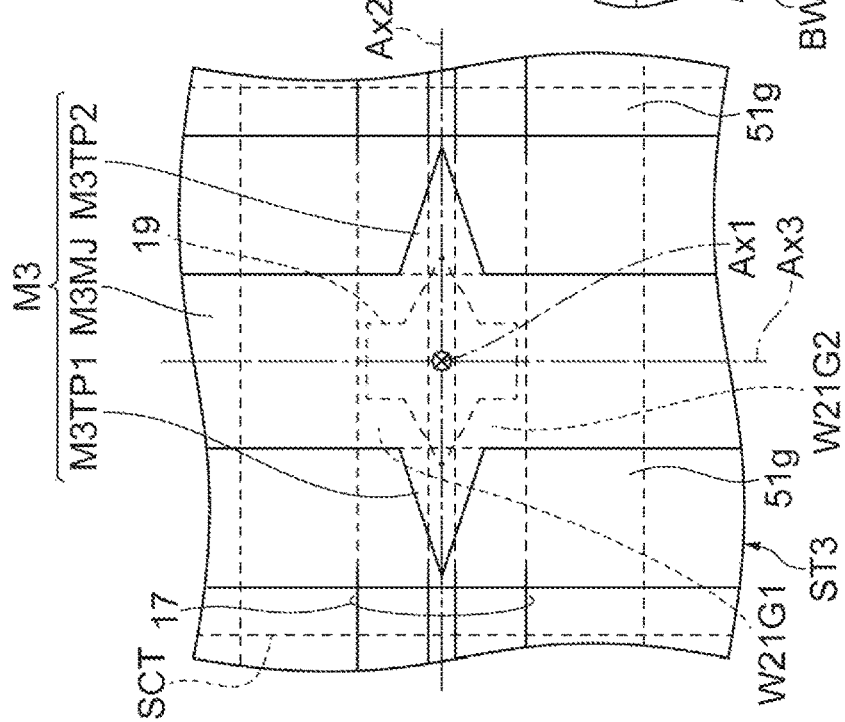

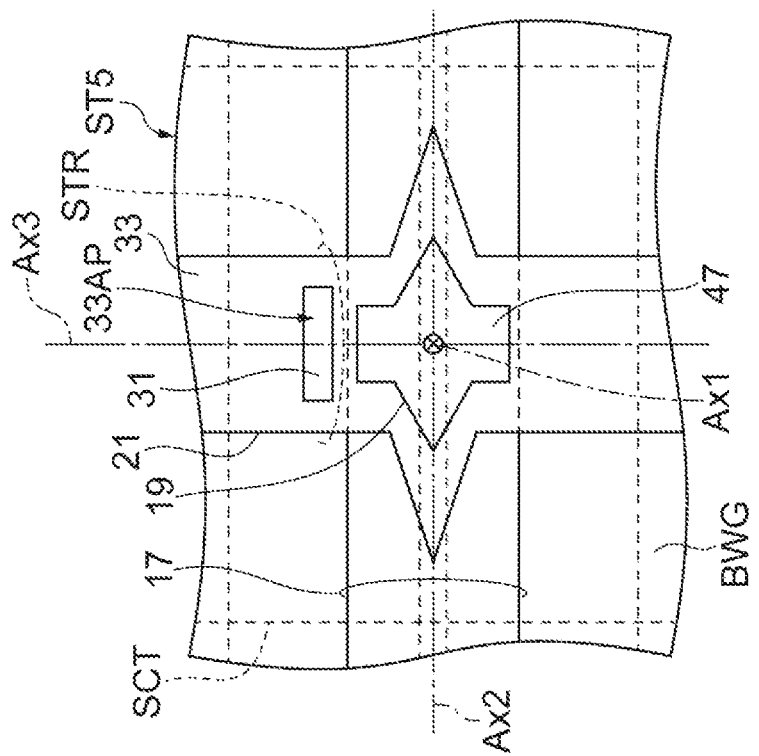
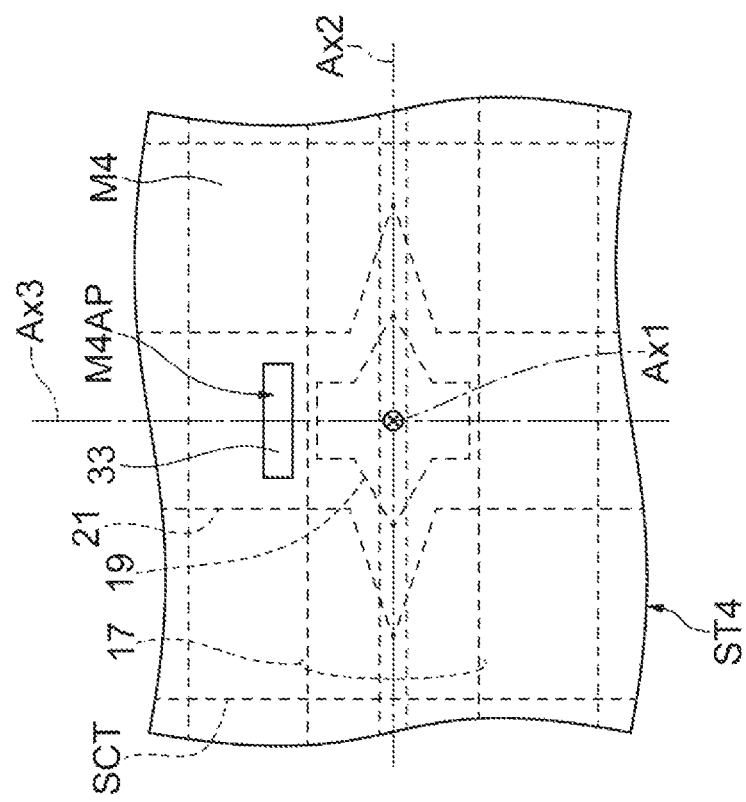

HYBRID OPTICAL ASSEMBLY AND METHOD FOR FABRICATING SAME

BACKGROUND OF THE INVENTION

Field of the Invention

The present invention relates to a hybrid optical assembly and a method for fabricating a hybrid optical assembly. This application claims the benefit of priority from Japanese Patent application No. 2018-024202 filed on Feb. 14, 2018, which is herein incorporated by reference in its entirety.

Related Background Art

Alexander W. Fangl, Hyundai Park, Oded Cohen, Richard Jones, Mario J. Paniccia, and John E. Bowers " Electrically pumped hybrid AlGaInAs-silicon evanescent laser" Optics Express Vol. 14, No. 20, 2006, referred to as Non-patent document 1, discloses a photonic laser assembly.

SUMMARY OF THE INVENTION

A hybrid optical assembly according to one aspect of an embodiment includes: a photonic device having a waveguide structure, the waveguide structure including group IV semiconductor and oxide; and an optical source device being bonded to the photonic device, the optical source device having a first semiconductor mesa and a second semiconductor mesa, the optical source device and the waveguide structure of the photonic device being arranged in a direction of a first axis, the first semiconductor mesa and the second semiconductor mesa extending in a direction of a second axis intersecting the first axis, the second semiconductor mesa having a length larger than that of the first semiconductor mesa, the first semiconductor mesa including an upper core layer and a first upper cladding layer, the upper core layer including group III-V semiconductor, the first upper cladding layer including group III-V semiconductor of a first conductivity-type, the upper core layer including an active region, the second semiconductor mesa including an lower core layer and a second upper cladding layer, the lower core layer including group III-V semiconductor of a second conductivity-type opposite to the first conductivity-type, the second upper cladding layer including group III-V semiconductor, the photonic device, the lower core layer, the second upper cladding layer, the upper core layer, and the first upper cladding layer being sequentially arranged in the direction of the first axis.

A method for fabricating a hybrid optical assembly according to another aspect of an embodiment includes: preparing laminate components, each of the laminate components having an insulating thin film, a semiconductor laminate and a semiconductor base mounting the semiconductor laminate, the insulating thin film being disposed on a first face of the semiconductor laminate, and the semiconductor laminate including semiconductor layers for a first upper cladding layer, an upper core layer, a second upper cladding layer, and a lower core layer, the semiconductor layers being sequentially arranged on a principal surface of the semiconductor base; preparing a waveguide substrate having an array of device sections, each of the device sections having a waveguide structure, and the waveguide structure including oxide and group IV semiconductor; bonding the laminate components to the device sections of the waveguide substrate to form a laminate product including the waveguide structure and the laminate components; removing the semiconductor base from the laminate product so as to expose a second face of the semiconductor laminate, the second face being opposite to the first face; after removing the semiconductor base, processing the semiconductor laminate to form a first semiconductor mesa including the upper core layer and the first upper cladding layer, the upper core layer including an active region; and after forming the first semiconductor mesa, processing the semiconductor laminate to form a second semiconductor mesa including the lower core layer and the second upper cladding layer.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 8A is a schematic cross-sectional view showing a major step in the method according to the embodiment.

FIG. 8B is a schematic cross-sectional view showing a major step in the method according to the embodiment.

FIG. 15A is a schematic plan view showing a major step in the method according to the embodiment.

FIG. 15B is a schematic cross-sectional view showing a major step in the method according to the embodiment.

FIG. 16A is a schematic plan view showing a major step in the method according to the embodiment.

FIG. 16B is a schematic plan view showing a major step in the method according to the embodiment.

DESCRIPTION OF THE EMBODIMENTS

Figure 1:
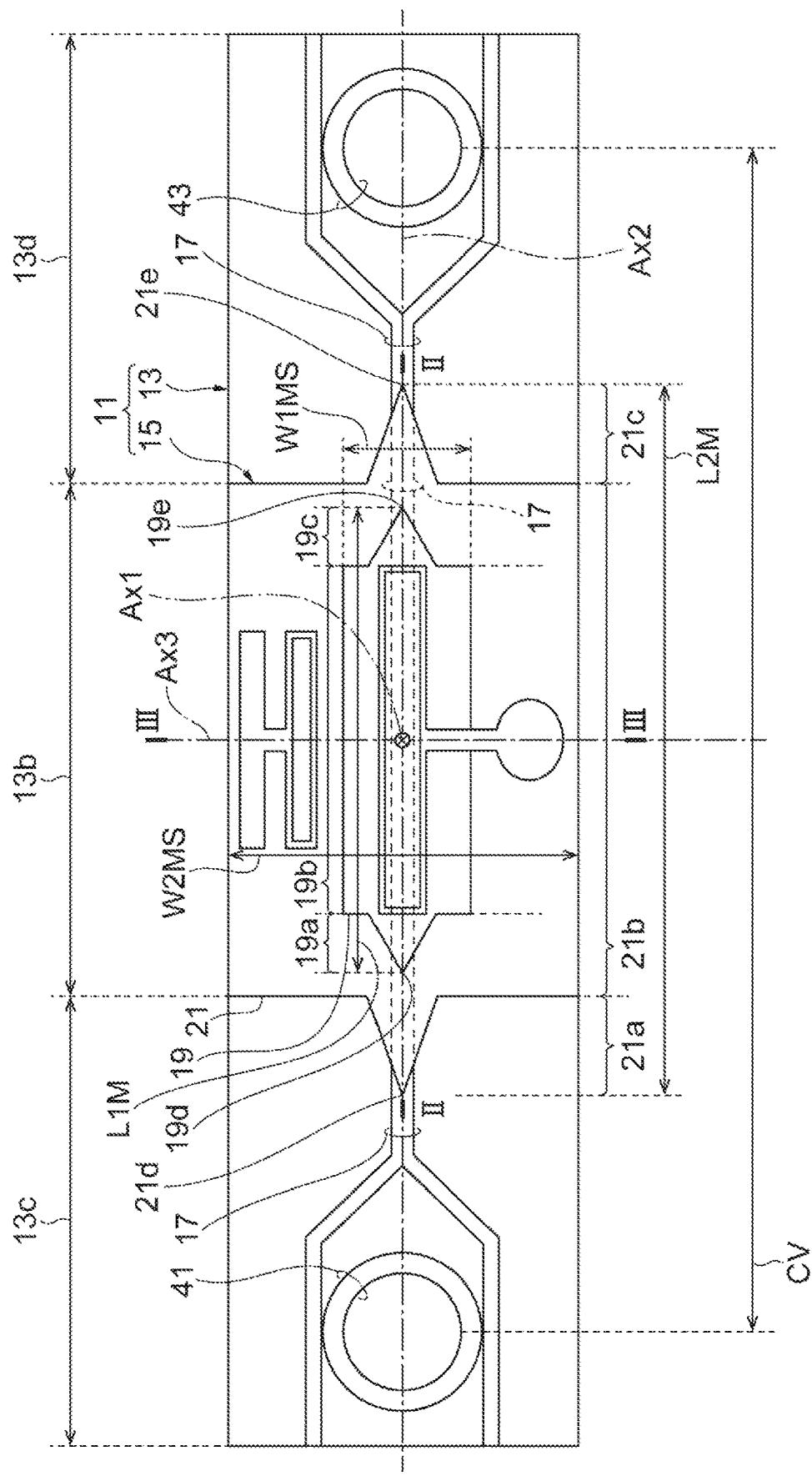
FIG. 1 is a schematic plan view showing a major structure of a hybrid optical assembly according to the present embodiment.

The photonic laser assembly in Non-Patent Document 1 includes an InP-based active device and a Silicon-On-Insulator (SOI) substrate including an Si-based photonic waveguide. The InP-based active device includes an active layer, and the active layer is located very close to the Si-based photonic optical waveguide. The Si-based photonic laser assembly allows a light beam to propagate through the Si-based photonic waveguide.

The inventors' knowledge reveals that the photonic laser assembly in Non-Patent Document 1 imposes restrictions on the structure and design of an active device that provides a light source. One of the constraints is that the semiconductor layer that is disposed between the Si-based photonic waveguide and the active layer, which has a MQW structure, of the active device should be carefully designed in the thickness and refractive index thereof, and in particular, making the optical coupling between the active device and the Si-based photonic waveguide large in the photonic laser device requires the semiconductor layer to have a small thickness, so that the photonic laser device prevents the semiconductor layer from having a large thickness. For example, the limitation in thickness of the semiconductor layer may prevent the current path to the MQW active layer in the active device from having a low electrical resistance. What is desired is to eliminate some or all of the constraints associated with the light source coupled to the Si-based photonic waveguide in the photonic laser device.

A description will be given of examples according to the aspects of the present embodiment below.

A hybrid optical assembly according to an embodiment includes: (a) a photonic device having a waveguide structure, the waveguide structure including group IV semiconductor and oxide; and (b) an optical source device being bonded to the photonic device. The optical source device has a first semiconductor mesa and a second semiconductor mesa. The optical source device and the waveguide structure of the photonic device are arranged in a direction of a first axis. The first semiconductor mesa and the second semiconductor mesa extend in a direction of a second axis intersecting the first axis. The second semiconductor mesa has a length larger than that of the first semiconductor mesa. The first semiconductor mesa includes an upper core layer and a first upper cladding layer. The upper core layer includes group III-V semiconductor. The first upper cladding layer includes group III-V semiconductor of a first conductivity-type. The upper core layer includes an active region. The second semiconductor mesa includes a lower core layer and a second upper cladding layer. The lower core layer includes group III-V semiconductor of a second conductivity-type opposite to the first conductivity-type. The second upper cladding layer includes group III-V semiconductor. The photonic device, the lower core layer, the second upper cladding layer, the upper core layer, and the first upper cladding layer are arranged sequentially in the direction of the first axis.

The hybrid optical assembly is provided with the arrangement of the waveguide structure in the photonic device and the first and second semiconductor mesas in the light source device, and the arrangement allows the waveguide structure to be optically coupled with the second semiconductor mesa and allows the second semiconductor mesa to be optically coupled with the first semiconductor mesa of the light source device. The first and second semiconductor mesas, which are arranged to extend in the direction of the second axis, allow a light beam to transition from the waveguide structure to the first and second semiconductor mesas and to transition back from the first and second semiconductor mesas to the waveguide structure. The optical coupling between the second semiconductor mesa and the first semiconductor mesa, which has a length smaller than that of the second semiconductor mesa, allows the bidirectional transitions of light between the first and second semiconductor mesas.

The first and second semiconductor mesas include a first upper cladding layer made of III-V semiconductor of a first-conductivity (hereinafter referred to as a first-conductivity III-V semiconductor) and a lower core layer made of III-V semiconductor of a second-conductivity (hereinafter referred to as a second-conductivity III-V semiconductor), respectively. The arrangement of the first and second semiconductor mesas allows electrical carriers to flow from the first upper cladding layer in the first semiconductor mesa to the lower core layer in the second semiconductor mesa.

The second-conductivity III-V semiconductor of the lower core layer has a thickness allowing the second-conductivity III-V semiconductor to work as a core such that a light beam can propagate therein, and has an electrical conductivity allowing carriers to flow into the upper core layer having optical activity. The second-conductivity III-V semiconductor is used in the lower core layer to provide the carriers with a good conduction path.

The upper core layer of the first semiconductor mesa is provided with current blocking regions and the active region, which are arranged in the direction of the second axis. The active region and the current blocking regions thus arranged can confine carriers into the active region, and allows light to propagate in both the active region and the current block region.

In the hybrid optical assembly according to an embodiment, the second semiconductor mesa further includes a lower cladding layer; the lower cladding layer is disposed between the lower core layer and the waveguide structure; and the lower cladding layer of the second semiconductor mesa has a thickness smaller than that of the second upper cladding layer.

The hybrid optical assembly provides the lower cladding layer with a small thickness, which can optically separate the waveguide structure from the lower core layer of the second semiconductor mesa. The lower cladding layer of the second semiconductor mesa has a refractive index greater than that of the upper cladding in the photonic device, thereby facilitating the optical coupling between the lower core layer of the second semiconductor mesa and the waveguide structure of the photonic device.

In the hybrid optical assembly according to an embodiment, the photonic device has a first ring resonator and a second ring resonator; and the waveguide structure couples the first ring resonator to the second ring resonator.

The hybrid optical assembly is provided with the first and second ring resonators of the photonic device to form an optical cavity that reflects light from the light source device.

A method for fabricating a hybrid optical assembly according to an embodiment includes: (a) preparing laminate components, each of the laminate components having an insulating thin film, a semiconductor laminate for a first upper cladding layer, an upper core layer, a second upper cladding layer, and a lower core layer, and a semiconductor base mounting the semiconductor laminate, the insulating thin film being disposed on a first face of the semiconductor laminate, and the semiconductor laminate including semiconductor layers for the first upper cladding layer, the upper core layer, the second upper cladding layer, and the lower core layer, the semiconductor layers being sequentially arranged on a principal surface of the semiconductor base; (b) preparing a waveguide substrate having an array of device sections, each of the device sections having a waveguide structure, and the waveguide structure including oxide and group IV semiconductor; (c) bonding the laminate components to the device sections of the waveguide substrate to form a laminate product including the waveguide structure and the insulating thin film; (d) removing the semiconductor base from the laminate product so as to expose a second face of the semiconductor laminate, the second face being opposite to the first face; (e) after removing the semiconductor base, processing the semiconductor laminate to form a first semiconductor mesa including the upper core layer and the first upper cladding layer, the upper core layer including an active region; and (f) after forming the first semiconductor mesa, processing the semiconductor laminate to form a second semiconductor mesa including the lower core layer and the second upper cladding layer.

The method of fabricating the hybrid optical assembly includes bonding the insulating thin film of the laminate component to the waveguide substrate to form the laminate product and then forming the first and second semiconductor mesas by photolithography and etching. The laminate component is aligned with the waveguide substrate to form an optical coupling structure therebetween, and the laminate product is processed using photolithography and etching to make the semiconductor mesas optically coupled.

The method according to an embodiment further includes: etching the second upper cladding layer of the second semiconductor mesa to form an opening in the second upper cladding layer, the opening reaching the lower core layer; forming an insulating film on the first semiconductor mesa, the second semiconductor mesa, and the waveguide substrate, the insulating film having a first opening on the first semiconductor mesa and a second opening on the second semiconductor mesa; and forming a first electrode and a second electrode, the first electrode and the second electrode being connected to the first semiconductor mesa and the second semiconductor mesa through the first opening and the second opening of the insulating film, respectively. The first opening of the insulating film is disposed on the opening of the second upper cladding layer.

This method can provide the lower core layer, which has a large thickness, working as not only a low-resistance current path but also a contact layer.

In the method according to an embodiment, preparing the laminate components includes: growing the semiconductor laminate on the semiconductor base to form an epitaxial substrate; forming a mask on the epitaxial substrate; etching the epitaxial substrate with the mask to form a butt-joint mesa, the butt-joint mesa including the semiconductor layers for the first upper cladding layer and the active region; growing a semiconductor layer for a current blocking region with the mask to embed the butt-joint mesa; after growing the semiconductor layer for the current blocking region with the mask, depositing an inorganic insulating layer for the insulating thin film to form a substrate product; and separating the substrate product into the laminate components.

This method produces the laminate component using epitaxial growth, photolithography and etching.

Teachings of the present invention can be readily understood by considering the following detailed description with reference to the accompanying drawings shown as examples. Referring to the accompanying drawings, a hybrid optical assembly, and a method for fabricating a hybrid optical assembly according to examples of the present embodiment will be described below. To facilitate understanding, identical reference numerals are used, where possible, to designate identical elements that are common to the figures.

Figure 2:
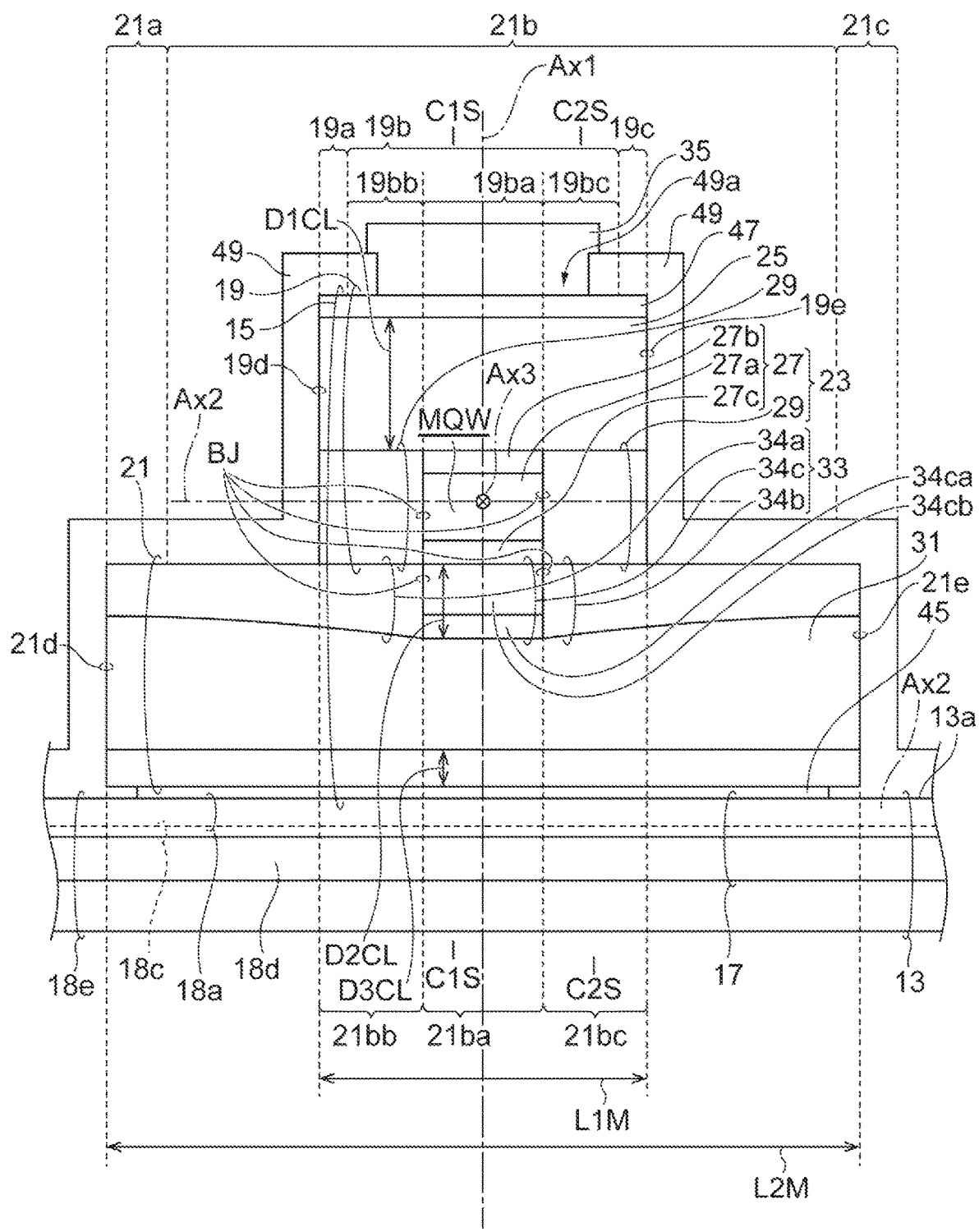
FIG. 2 is a cross-sectional view taken along line II-II in FIG. 1.
Figure 3:
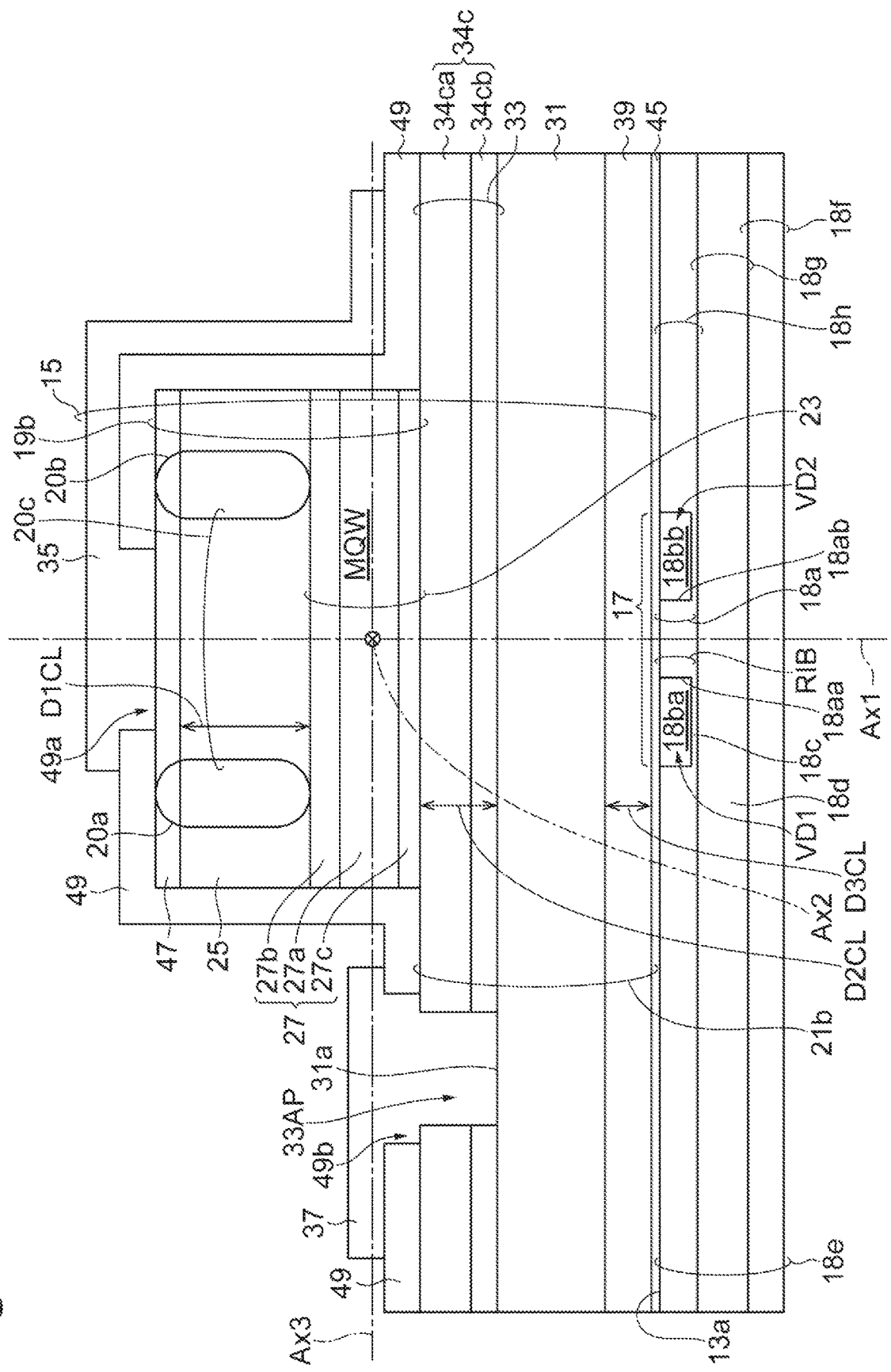
FIG. 3 is a cross-sectional view taken along line III-III shown in FIG. 1.

FIG. 1 is a schematic plan view showing the structure of a hybrid optical assembly according to the embodiment. FIG. 2 is a cross-sectional view, taken along line II-II in FIG. 1. FIG. 3 is a cross-sectional view taken along line III-III shown in FIG. 1.

The hybrid optical assembly 11 includes a photonic device 13 and a light source device 15. The photonic device 13 has a waveguide structure 17 which includes group IV semiconductor and oxide, and in particular, may include a silicon-based photonic device. The light source device 15 includes a group III-V semiconductor, and generates light in response to the application of electric power. The photonic device 13 and the light source device 15 form a junction with each other. The light source device 15 has a first semiconductor mesa 19 and a second semiconductor mesa 21. The light source device 15 and the waveguide structure 17 of the photonic device 13 are arranged in the direction of the first axis Ax1, and the second semiconductor mesa 21 is disposed between the first semiconductor mesa 19 and the waveguide structure 17. The first and second semiconductor mesas 19 and 21 extend in the direction of the second axis Ax2, which intersects the first axis Ax1. The first and second semiconductor mesas 19 and 21 have a first mesa length M1L and a second mesa length M2L, respectively, and the second mesa length M2L is larger than the first mesa length M1L.

The first semiconductor mesa 19 has an upper core layer 23 including a III-V semiconductor, and a first upper cladding layer 25 including a first-conductivity III-V semiconductor. The upper core layer 23 includes an active region 27. The active region 27 has an active layer 27a which has a band structure enabling optical transition in response to injection of carriers to generate light, and may further include a first spacer layer 27b and a second spacer layer 27c. The active layer 27a is disposed between the first and second spacer layers 27b and 27c. The active layer 27a may have, for example, a quantum well structure MQW. The quantum well structure MQW includes one or more well layers and multiple barrier layers, and the well and barrier layers are alternately arranged in the direction of the first axis Ax1. The upper core layer 23 further includes a current blocking region 29. The active region 27 and the current blocking region 29 are arranged in the direction of the second axis Ax2. The upper core layer 23 and the first upper cladding layer 25 are arranged in the direction of the first axis Ax1.

The second semiconductor mesa 21 has a lower core layer 31 and a second upper cladding layer 33. The lower core layer 31 includes a second-conductivity III-V semiconductor, and the second upper cladding layer 33 includes a group III-V semiconductor. The lower core layer 31 and the second upper cladding layer 33 are arranged in the direction of the first axis Ax1.

The lower core layer 31, the second upper cladding layer 33, the upper core layer 23, and the first upper cladding layer 25 are arranged on the waveguide structure 17 of the photonic device 13 in the direction of the first axis Ax1.

The hybrid optical assembly 11is provided with the arrangement of the waveguide structure 17 of the photonic device 13 and the first and second semiconductor mesas 19 and 21 of the light source device 15, and this arrangement allows both the optical coupling between the second semiconductor mesa 21 and the waveguide structure 17 and the optical coupling between the first and second semiconductor mesas 19 and 21. The first and second semiconductor mesas 19 and 21 extend along each other in the direction of the second axis Ax2, and allow a light beam to propagate from the waveguide structure 17 to the first and semiconductor mesas 19 and 21. The first semiconductor mesa 19 is provided with a length smaller than that of the second semiconductor mesa 21, which results in that the optical coupling between the first and second semiconductor mesas 19 and 21 enables bidirectional transitions of light, specifically the optical propagation from the second semiconductor mesa 21 to the first semiconductor mesa 19 and the optical propagation from the first semiconductor mesa 19 to the second semiconductor mesa 19. The second semiconductor mesa 21 is provided with the length larger than that of the first semiconductor mesa 19, which results in that the optical coupling between the second semiconductor mesa 21 and the waveguide structure 17 enables bidirectional transitions of light, specifically the optical propagation from the waveguide structure 17 to the second semiconductor mesa 19 and the optical propagation from the second semiconductor mesa 21 to the waveguide structure 17.

The first and second semiconductor mesas 19 and 21 have a first upper cladding layer 25 and a lower core layer 31, respectively. The first upper cladding layer 25 includes a first-conductivity III-V semiconductor, and the lower core layer 31 includes a second-conductivity III-V semiconductor. The arrangement of the first and second semiconductor mesas 19 and 21 enables carriers to flow from the first upper cladding layer 25 in the first semiconductor mesa 19 to the lower core layer 31 in the second semiconductor mesa 21.

The second-conductivity III-V semiconductor of the lower core layer 31 has a thickness allowing this III-V semiconductor to work as a core and allowing a light beam to propagate therein, and has an electrical conductivity allowing carriers to flows into the upper core layer 23 having optical activity. The second-conductivity III-V semiconductor gives the carriers a good conduction path in terms of the thickness of the lower core layer 31.

The upper core layer 23 of the first semiconductor mesa 19 is provided with the active region 27 and the current blocking region 29, and the active region 27 and the current blocking region 29 are arranged in the direction of the second axis Ax2, allowing both the confinement of carriers into the active region 27 and the confinement of light into the active region 27 and the current blocking region 29.

The second semiconductor mesa 21 further has a lower cladding layer 39 including a III-V semiconductor. The first upper cladding layer 25, the second upper cladding layer 33, and the lower cladding layer 39 have a first thickness D1CL, a second thickness D2CL, and a third thickness D3C1, respectively. The second thickness D2CL of the second upper cladding layer 33 and the third thickness D3C1 of the lower cladding layer 39 are smaller than the first thickness D1CL of the first upper cladding layer 25. The third thickness D3C1 is smaller than the second thickness D2CL. The thin lower cladding layer 39 ensures the optical separation between the waveguide structure 17 and the lower core layer 31 of the second semiconductor mesa 21.

The hybrid optical assembly 11 provides the lower cladding layer 39 of the second semiconductor mesa 21 with a refractive index lower than that of the upper cladding layer of the photonic device 13, thereby making the optical coupling between the waveguide structure 17 and the lower core layer 31 easy.

The waveguide structure 17 includes a core region 18a, a first cladding region 18ba and a second cladding region 18bb. The core region 18a extends along the principal surface 13a of the photonic device 13 and includes a group IV semiconductor, such as, silicon, and the first and second cladding regions 18ba and 18bb extend along both sides of the core region 18a. The core region 18a has a first side face 18aa and a second side face 18ab which extend in the direction of the second axis Ax2. In the present embodiment, the first and second side faces 18aa and 18ab are defined by voids extending along the core region 18a just beneath, for example, the light source device 15. These voids may be replaced with the first and second cladding regions 18ba and 18bb each of which may include a material having a refractive index lower than that of the core region 18a.

In the embodiment, the photonic device 13 includes a first ring resonator 41 and a second ring resonator 43, and the first and second ring resonators 41 and 43 are optically coupled to each other through the waveguide structure 17 to define an optical cavity in the hybrid optical assembly 11. The optical cavity that includes the first and second ring resonators 41 and 43 can reflects light produced by the light source device. The photonic device 13 is not limited to the present example, but may have, for example, a distributed Bragg reflector (DBR mirror) including a diffraction grating. The first and second ring resonators 41 and 43 in the photonic device 13 form the lasing cavity CV in the hybrid optical assembly 11. The light source device 15 is optically coupled to the waveguide structure 17 in the laser resonator CV to provide a hybrid laser device.

The photonic device 13 includes a first region 13b, a second region 13c, and a third region 13d. The second region 13c, the first region 13b, and the third region 13d are sequentially arranged in the direction of the second axis Ax2. The first region 13b is provided with the waveguide structure 17, which is optically coupled to the light source device 15, and the waveguide structure 17 extends in the direction of the second axis Ax2 in the first region 13b. The second and third regions 13c and 13d are provided with the first and second ring resonators 41 and 43. In the present embodiment, each of the first and second ring resonators 41 and 43 has two parts coupled to the waveguide structure 17.

Specifically, the core region 18a made of silicon may have a rib shape (RIB) on a silicon base region, and the silicon base region 18c extends over a lower cladding region 18d. The lower cladding region 18d includes a silicon-based inorganic insulator, such as, silicon oxide. The width and height of the silicon ridge can be, for example, 2 micrometers and 0.2 micrometers, respectively. The photonic device 13 includes, for example, an SOI substrate 18e, and the SOI substrate 18e includes a silicon support 18f, a silicon oxide layer 18g (18d) and a silicon layer 18h (18a and 18c). The silicon oxide layer 18g and the silicon layer 18h are arranged on the silicon support 18f.

In the embodiment, the hybrid optical assembly 11 provides the waveguide structure 17 of the photonic device 13 with a core strip of the silicon layer of the SOI substrate 18e, and a first void VD1 and a second void VD2 that define the core strip.

The light source device 15 includes an inorganic insulating layer 45 forming a junction with the principal surface 13a of the photonic device 13. Specifically, the inorganic insulating layer 45 forms an interface with, for example, the upper face of the core region 18a.

Referring to FIGS. 1 and 2, the first semiconductor mesa 19 includes a first portion 19a, a second portion 19b, and a third portion 19c. The second portion 19b, the first portion 19a, and the third portion 19c are sequentially arranged in the direction of the second axis Ax2. Specifically, in the first semiconductor mesa 19, the second portion 19b is provided with the first upper cladding layer 25 and the active region 27, and each of the first and third portions 19a and 19c is provided with the first upper cladding layer 25 and the current block region 29.

The first mesa length M1L of the first semiconductor mesa 19
Length of the second portion 19b: 300 to 1000 micrometers, for example, 500 micrometers.
Length of each of the first and third portions 19a and 19c: 10 to 50 micrometers, for example, 10 micrometers. The second mesa length MIL is longer.

In the first semiconductor mesa 19, the hybrid optical assembly 11 allows the current block region 29 in each of the first, second and third portions 19a, 19b and 19c to confine carriers into the active region 27 of the second portion 19b. Specifically, the second portion 19b has an active section 19ba, a first confining section 19bb and a second confining section 19bc, and the active section 19ba includes the active region 27, and the first and second confining sections 19bb and 19bc each include the current block region 29. The first confining section 19bb, the active section 19ba and the second confining section 19bc are arranged in the direction of the second axis Ax2.

The second portion 19b has a first mesa width W1MS. Each of the first and third portions 19a and 19c has one end 19d and the other end 19e. The first and third portions 19a and 19c each have a part of a width smaller than the first mesa width W1MS. The hybrid optical assembly 11 provides the first portion 19a in the first semiconductor mesa 19 with a mesa width smaller than that of each of the second and third portions 19b and 19c to facilitate transition of light between the first and second semiconductor mesas 19 and 21.

Specifically, the first portion 19a has a tapered part, which has a width gradually decreasing from the first mesa width W1MS in a direction from the second portion 19b to the first portion 19a toward the one end 19d. The third portion 19c also has a tapered part, which has a width gradually decreasing from the first mesa width W1MS in a direction from the second portion 19b to the third portion 19c toward the other end 19e.

Referring to FIG. 3, the first semiconductor mesa 19 has a first electrically isolating region 20a, a second electrically isolating region 20b, and a conductive region 20c in the second portion 19b. The first and second electrically isolating regions 20a and 20b, which have a high specific resistance, extend in the direction of the first axis Ax1 to reach the active region 27. The conductive region 20c is disposed between the first and second electrically isolating regions 20a and 20b.

In the second portion 19b of the first semiconductor mesa 19, the first upper cladding layer 25 is divided by the first and second electrically isolating regions 20a and 20b, which guide carriers to the active region 27 in the first upper cladding layer 25. In the present embodiment, the first and second electrically isolating regions 20a and 20b each have a specific resistance higher than that of the conductive region 20c.

The hybrid optical assembly 11 is provided with the first and second electrically isolating regions 20a and 20b, which confine carriers in the direction of the third axis Ax3, which intersects the first and second axes Ax1 and Ax2, in the first upper cladding layer 25 in the first upper cladding layer 25. The first and second electrically isolating regions 20a and 20b can be formed by, for example, proton implantation, and each have a hydrogen concentration higher than that of the conductive region 20c. The first and second electrical isolation regions 20a and 20b each have a crystal lattice disordered by ion implantation, which brings these electrical isolation regions the respective high hydrogen concentrations without any additional semiconductor epitaxial growth.

If necessary, the first semiconductor mesa 19 may have a contact layer 47 including a first-conductivity III-V semiconductor, and forms an interface with the first upper cladding layer 25, which is disposed between the upper core layer 23 and the contact layer 47.

Referring to FIGS. 1 and 2, the second semiconductor mesa 21 includes a first portion 21a, a second portion 21b, and a third portion 21c, and the second portion 21b, the first portion 21a, and the third portion 21c are sequentially arranged in the direction of the second axes Ax2. In the second semiconductor mesa 21, the first, second and third portions 21a, 21b and 21c each include a lower core layer 31 and a second upper clad layer 33.

The second mesa length M2L of the second semiconductor mesa 21.
Length of the second portion 21b: 400 to 1100 micrometers, for example 600 micrometers.
Length of the first and third portions 21a and 21c: 20 to 50 micrometers, for example 30 micrometers.

The second upper cladding layer 33 has a thickness smaller than that of the first upper cladding layer 25. The second upper cladding layer 33, which is thinner than the first upper cladding layer 25 in thickness, enables both the isolation and transitions of light between the first and second semiconductor mesas 19 and 21 in the hybrid optical assembly 11.

The second portion 21b has a second mesa width W2MS, and in the present embodiment, the second semiconductor mesa 21 has substantially the same width as that of the photonic device 13. The first and third portions 21a and 21c has one end 21d and the other end 21e, respectively. Each of the first and third first portions 21a and 21c has a part smaller than the second mesa width W2MS. These ends 21d and 21e are disposed on the waveguide structure 17 of the photonic device 13. The second semiconductor mesa 21 is provided with the first and third portions 21a and 21c, each of which has a thickness smaller than the mesa width of the second portion 21b, to enable transitions of light in the hybrid optical assembly 11.

Specifically, the first portion 21a has a tapered part which has a width gradually decreasing from the second mesa width W2MS in a direction from the second portion 21b to the first portion 21a toward the one end 21d. The third portion 21c has a tapered part which has a width gradually decreasing from the second mesa width W2MS in a direction from the second portion 21b to the third portion 21c toward the other end 21e.

Referring to FIG. 2, in the second portion 21b of the second semiconductor mesa 21, the second upper cladding layer 33 includes a first high specific resistance region 34a, a second high specific resistance region 34b, and a conductive region 34c, which are arranged in the direction of the second axis Ax2, and extend in the direction of the third axis Ax3. The first and second high specific resistance regions 34a and 34b each have a specific resistance higher than that of the conductive region 34c. The first and second high specific resistance regions 34a and 34b each may be made of, for example, an undoped or Fe-doped III-V semiconductor, and the conductive region 34c may be made of a second-conductivity III-V semiconductor doped with, for example, an n-type or p-type dopant. In the embodiment, the conductive region 34c is disposed right under the active region 27 and is located between the first and second high specific resistance regions 34a and 34b, which extend in both directions from the conductive region 34c to the one end 21d and the other end 21e.

In the second semiconductor mesa 21, the hybrid optical assembly 11 allows the first and second high specific resistance regions 34a and 34b in the second upper cladding layer 33 to confine carriers into the conductive region 34c of the portion 21b in the direction of the second axis Ax2. Specifically, the second portion 21b has a conductive section 21ba immediately under the active region 27, a first guiding section 21bb with the first high specific resistance region 34a, and a second guiding section 21bc with the second high specific resistance region 34b. The first guiding section 21bb, the conductive section 21ba and the second guide section 21bc are arranged in the direction of the second axis Ax2.

The hybrid optical assembly 11 provides the second upper cladding layer 33 with the first and second high specific resistance regions 34a and 34b to allow these high specific resistance regions to confine carriers in the direction of the second axis Ax2. The conductive region 34c has a carrier concentration higher than that of each of the first and second high specific resistance regions 34a and 34b.

In the second semiconductor mesa 21, the lower core layer 31 in the first and third portions 21a and 21c has a thickness larger than that of the lower core layer 31 in the second portion 21b. Specifically, the lower core layer 31 includes first and second parts, which extend in the respective directions from the conductive region 34c to the ends 21d and 21e, and the first and second parts have respective thicknesses, which gradually increase in respective directions, opposite to each other, from the conductive region 34c to the ends 21d and 21e. The lower core layer 31 between the conductive portion 21ba and the photonic device 13 is thinner than the lower core layer 31 at the ends 21d and 21e in thickness. The second semiconductor mesa 21 may have a thicker core portion at each of the ends 21d and 21e, which cause the transitions of light rather than optical guiding.

The hybrid optical assembly 11 has a butt-joint structure BJ at the interface that the active region 27 and the current blocking region 29 form and the interfaces that the conductive region 34c and the first and second high specific resistance regions 34a and 34b form.

The light source device 15 includes a first electrode 35 and a second electrode 37, which are connected to the first and second semiconductor mesas 19 and 21, respectively. Specifically, the first electrode 35 makes contact with the top face of the first semiconductor mesa 19, and the second electrode 37 makes contact with the second semiconductor mesa 21. In the embodiment, the second upper cladding layer 33 in the second semiconductor mesa 21 has an opening 33AP to the lower core layer 31, and the second electrode 37 make contact with the upper face 31a of the lower core layer 31 through the opening 33AP. The lower core layer 31 has a bandgap smaller than that of the second upper cladding layer 33, and has a carrier concentration higher than that of the second upper cladding layer 33. The lower core layer 31, which is thicker than the second upper cladding layer 33 in thickness, allows carriers to flow from the second electrode 37 to the conductive region 34c of the second upper cladding layer 33 therethrough.

The hybrid optical assembly 11 may further include an insulating film 49 which covers the first and second semiconductor mesas 19 and 21 of the light source device 15. The insulating film 49 has a first opening 49a and a second opening 49b which allow the first and second electrodes 35 and 37 to make contact with the respective semiconductors. If necessary, the photonic device 13 may be covered with the insulating film 49, which can work as an overcladding layer to the photonic device 13.

Exemplary hybrid optical assembly 11 that can lase at 1550 nm band
Exemplary photonic device 13.
SOI substrate: silicone rib having a thickness of 200 nanometers, and lower cladding region having a thickness of 3 micrometers.
Exemplary light source device 15
First semiconductor mesa 19 (upper waveguide structure).
Contact layer 47: Zn-doped p-type GaInAs.
First upper cladding layer 25: Zn-doped p-type InP.
Upper core layer 23.
Active region 27.
Active layer 27a having a quantum well structure MQW: GaInAsP/GaInAsP.
First spacer layer 27b: i-type GaInAsP (having a bandgap wavelength of 1.2 micrometers) with a thickness of 100 nm.
Second spacer layer 27c: i-type GaInAsP (having a bandgap wavelength of 1.2 micrometers) with a thickness of 100 nm.
Current block region 29: i-type GaInAsP (having a bandgap wavelength of 1.3 micrometers) with a thickness of 300 nm.
The distance between the first and second electrically isolating regions 20a and 20b (the width of the conductive region 20c): 2 micrometers.
Second semiconductor mesa 21 (lower waveguide structure) Second upper cladding layer 33
First and second high specific resistance regions 34a and 34b: i-type InP
Conductive region 34c (cladding portion 34ca and spacer portion 34cb): Si-doped n-type InP and Si-doped n-type GaInAsP (having a bandgap wavelength of 1.2 micrometers) with a thickness of 100 nm.
Lower core layer 31: Si-doped $n^+$-type GaInAsP (having a bandgap wavelength of 1.3 micrometers) with a thickness of 300 nm.
Lower cladding layer 39: i-type GaInAsP (having a bandgap wavelength of 1.2 micrometers) with a thickness of 100 nm.
Inorganic insulating layer 45: silicon oxide film with a thickness of 10 nm.

Figure 4:
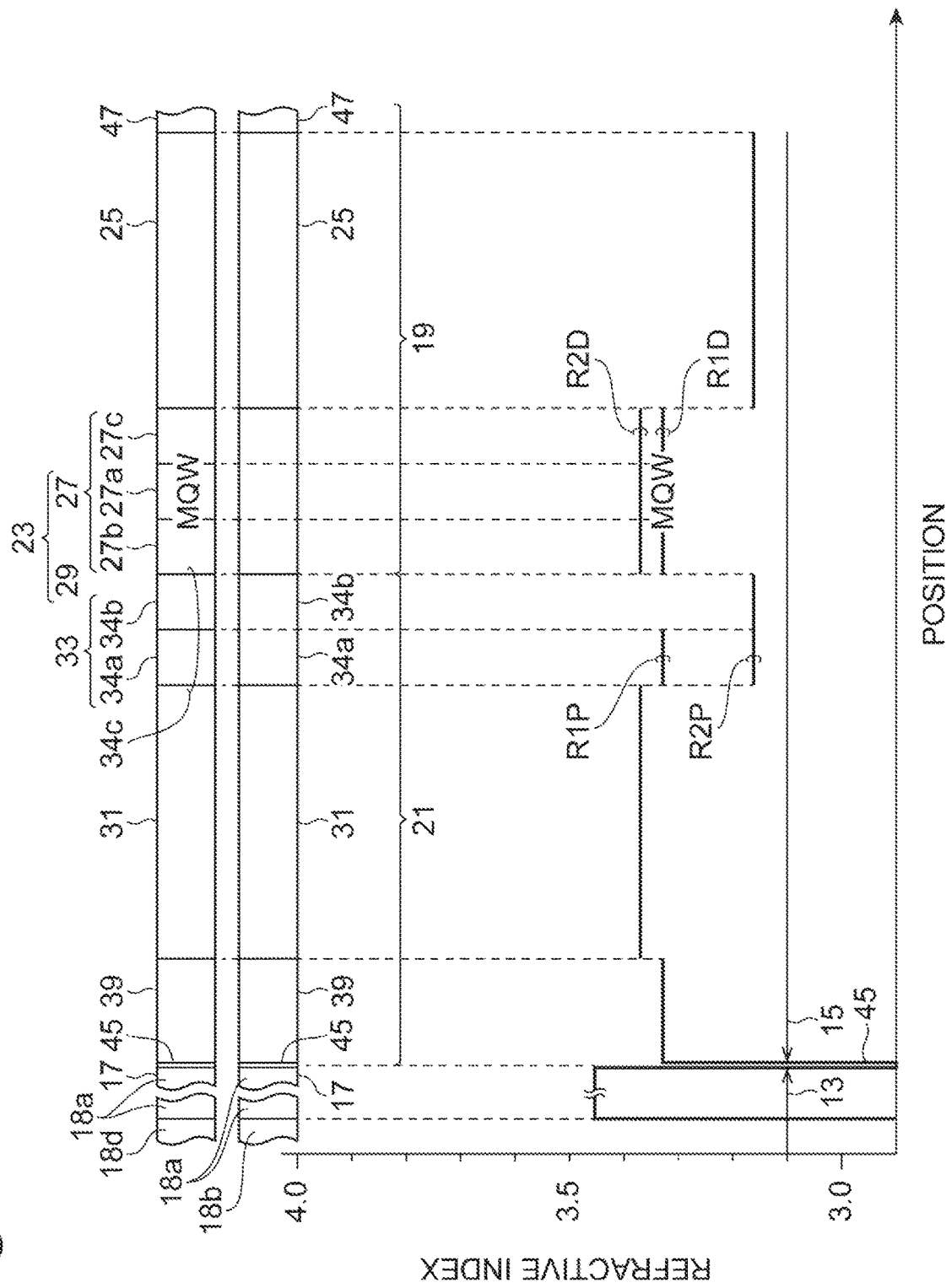
FIG. 4 is a view showing refractive index profiles at a first cross section and a second cross section in FIG. 2.

FIG. 4 is a graph showing refractive index profiles taken along the first and second cross sections in FIG. 2. The hybrid optical assembly 11 has a first refractive index profile R1P and a second refractive index profile R2P in the first and second cross sections C1S and C2S, respectively. The active region 27 appears at the first cross section C1S, and the current block region 29 appears at the second cross section C2S.

These refractive index profiles allows the second upper cladding layer 33 to separate the upper core layer 23 from the lower core layer 31, and allows the lower cladding layer 39 to separate the lower core layer 31 from the waveguide structure 17 of the photonic device 13. The lower cladding layer 39 has a refractive index larger than that of the second upper cladding layer 33. The lower core layer 31 is thicker than the upper core layer 23 in thickness. The second upper cladding layer 33 is thinner than the first upper cladding layer 25 in thickness. These refractive index profiles indicate that the hybrid optical assembly 11 has three cores.

A description will be given of a method for fabricating a hybrid optical assembly 11, such as a hybrid laser device, with reference to FIGS. 5A to 16B. For easy understanding, when possible, reference numerals used in the description made with reference to FIGS. 1 to 3 are used in the following description.

Figure 5A:
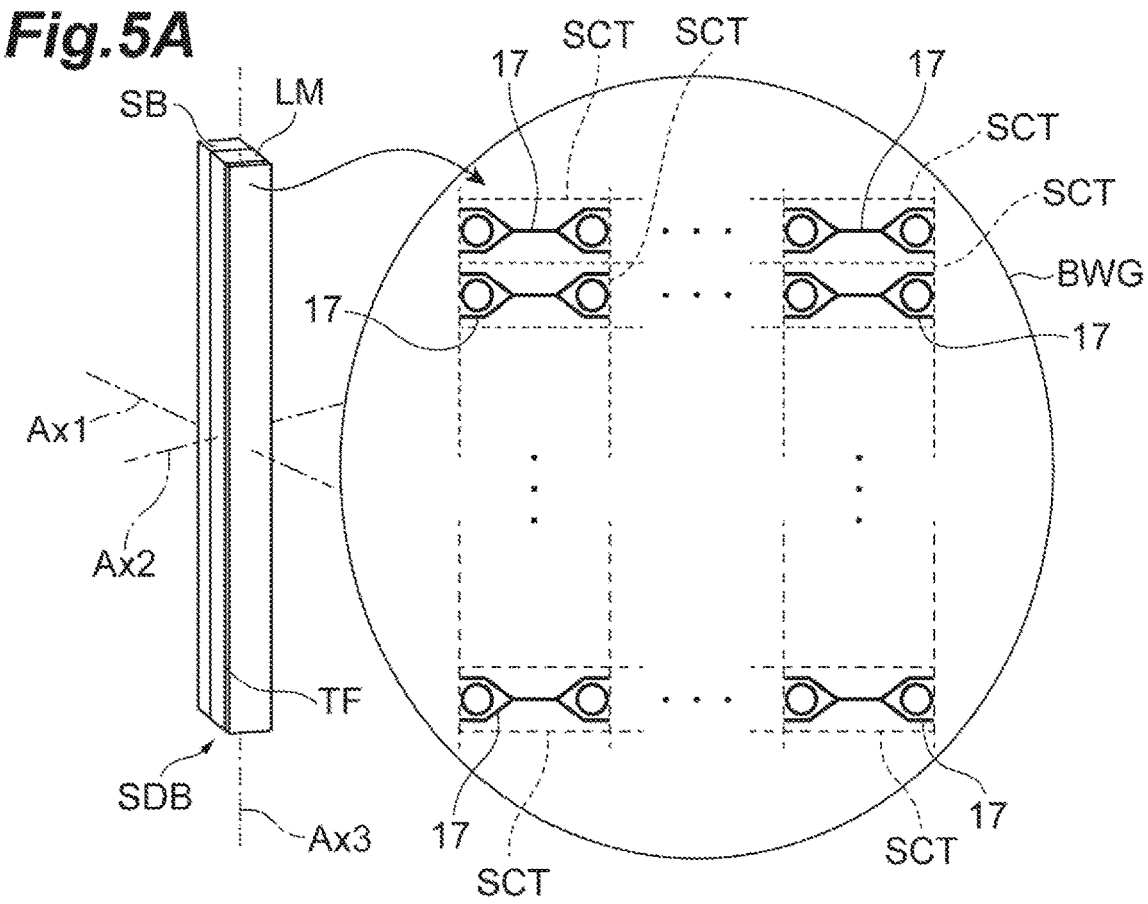
FIG. 5A is a schematic view showing a major step in a method of fabricating a hybrid laser device according to the embodiment.

As shown in FIG. 5A, a waveguide substrate BWG is prepared in step S101. The waveguide substrate BWG has device sections SCT, each of which includes the waveguide structure 17, arranged to form one- or two-dimensional array. The waveguide structure 17 includes a group IV semiconductor and an oxide, and may contain, for example, an SOI substrate.

In addition, a laminate component SDB is prepared which has a semiconductor laminate LM, a semiconductor substrate SB, and an insulating thin film TF. The semiconductor laminate LM includes semiconductor layers for the lower core layer 31, the second upper cladding layer 33, the upper core layer 23, and the first upper cladding layer 25. These semiconductor layers are sequentially stacked on the semiconductor substrate SB in the direction of the first axis Ax1, and specifically are stacked in the order of the contact layer 47, the first upper cladding layer 25, the upper core layer 23, the second upper cladding layer 33, the lower core layer 31, and the lower cladding layer 39. The insulating thin film TF is disposed on the first face of the semiconductor laminate LM.

In the embodiment, the laminate component SDB is fabricated in order to prepare the laminate component SDB. A description will be given of a method of fabricating a substrate product for the laminate component SDB with reference to FIGS. 6A to 9. In order to indicate the orientation of the laminate component SDB, the first, second and third axes Ax1, Ax2, and Ax3 are drawn in the figures.

Figure 6A:
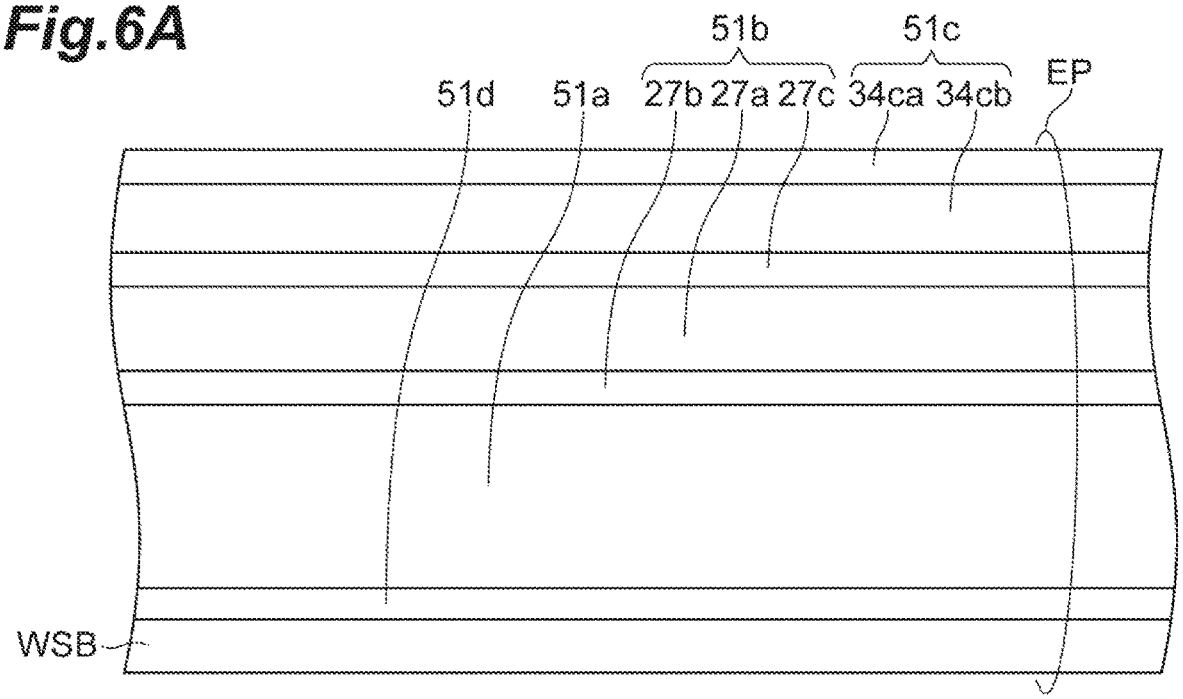
FIG. 6A is a schematic cross-sectional view showing a major step in the method according to the embodiment.

This method begins with the growth of the semiconductor crystal, for example, by metal organic vapor phase epitaxy. As shown in FIG. 6A, an epitaxial substrate EP is formed. Specifically, the epitaxial substrate EP is fabricated in the following manner. Multiple semiconductor layers are sequentially grown on a semiconductor substrate WSB to obtain the epitaxial substrate EP having semiconductor multilayer 51. The semiconductor substrate WSB may include, for example, $n^+$-InP. The semiconductor multilayer 51 is composed of a semiconductor layer 51a for the first upper cladding layer 25, a semiconductor layer 51b for the active region 27 in the upper core layer 23 (in particular, a first spacer layer, an active layer and a second spacer layer), and a semiconductor layer 51c for the second upper cladding layer 33 (the cladding portion 34ca and the spacer portion 34cb), and, if necessary, further includes a semiconductor layer 51d for the contact layer 47.

Exemplary semiconductor.
Semiconductor substrate WSB; $n^+$-InP wafer.
  Semiconductor multilayer 51
    Semiconductor layer 51c for the second upper cladding layer 33 (cladding portion 34ca and spacer portion 34cb): Si-doped n-type InP and Si-doped n-type GaInAsP (having a bandgap wavelength of 1.2 micrometers).
    Semiconductor layer 51b for the active region 27.
      First spacer layer 27b: i-type GaInAsP (having a bandgap wavelength of 1.2 micrometers) with a thickness of 100 nm. Active layer 27a: GaInAsP/GaInAsP quantum well structure MQW. Second spacer layer 27c: i-type GaInAsP (having a bandgap wavelength of 1.2 micrometers) with a thickness of 100 nm.
    Semiconductor layer 51a for the first upper cladding layer 25: Zn doped p-type InP.
    Semiconductor layer 51d for the contact layer 47: Zn-doped p-type GaInAs.

Figure 6B:
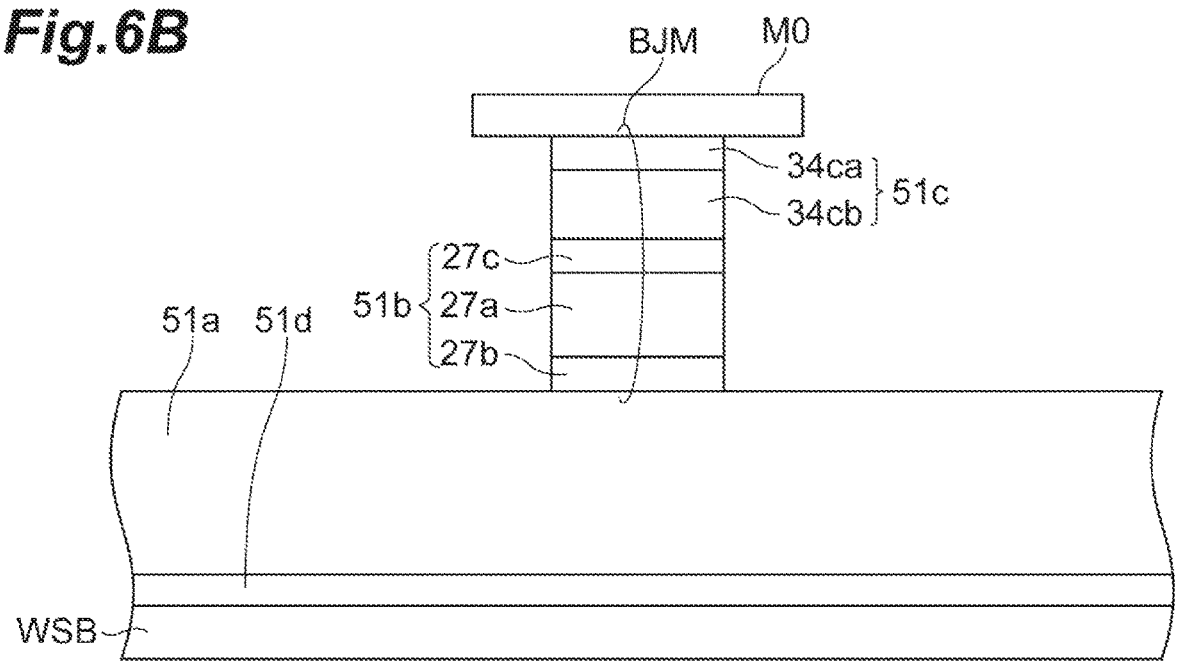
FIG. 6B is a schematic cross-sectional view showing a major step in the method according to the embodiment.

The epitaxial substrate EP is processed to form a butt-joint mesa BJM. Specifically, as shown in FIG. 6B, a mask M0 is formed on the epitaxial substrate EP and defines the butt-joint mesa BJM. This mask M0 is used to form a butt-joint mesa BJM by etching the epitaxial substrate EP. The butt-joint mesa BJM is provided with the semiconductor layer 51b for the active region 27 and the semiconductor layer 51c for the second upper cladding layer 33. The mask M0 may include a silicon-based inorganic insulating film, such as a silicon nitride film.

Figure 7A:
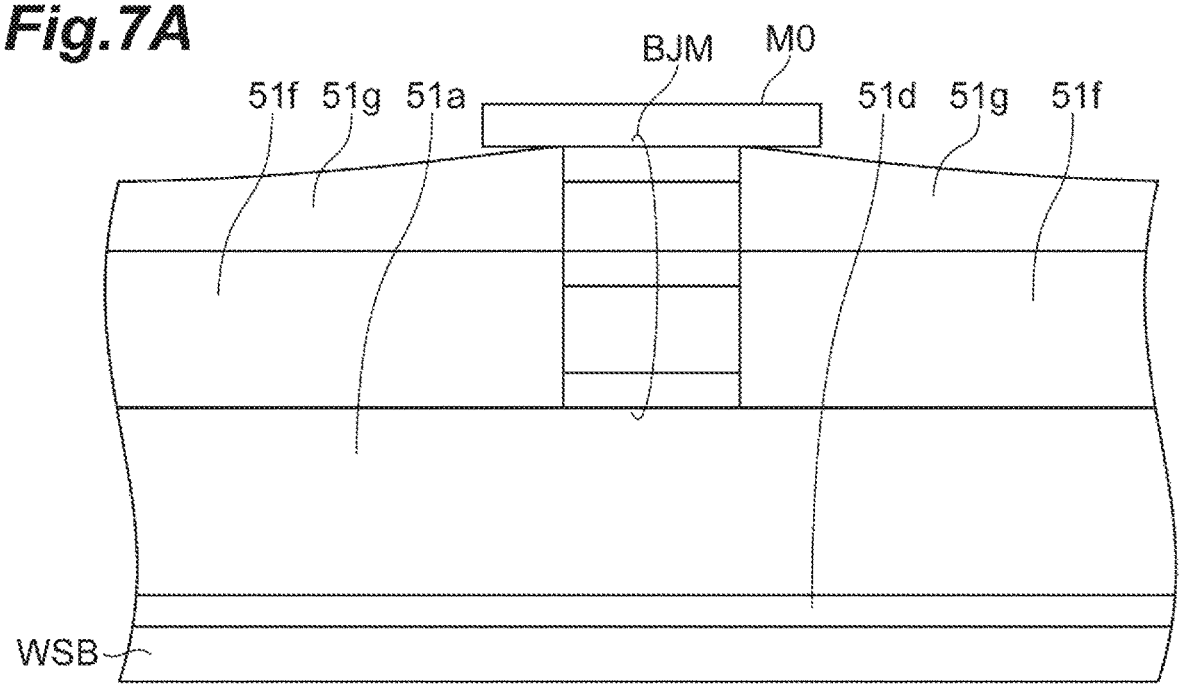
FIG. 7A is a schematic cross-sectional view showing a major step in the method according to the embodiment.

Forming the butt-joint mesa BJM is followed by selective growth of a semiconductor layer 51f for the current blocking region 29 and a semiconductor layer 51g for the second upper cladding layer 33. More specifically, as shown in FIG. 7A, the first regrowth is performed with the mask M0 to form the semiconductor layers 51f and 51g so as to embed the butt-joint mesa BJM on both sides thereof.

Figure 7B:
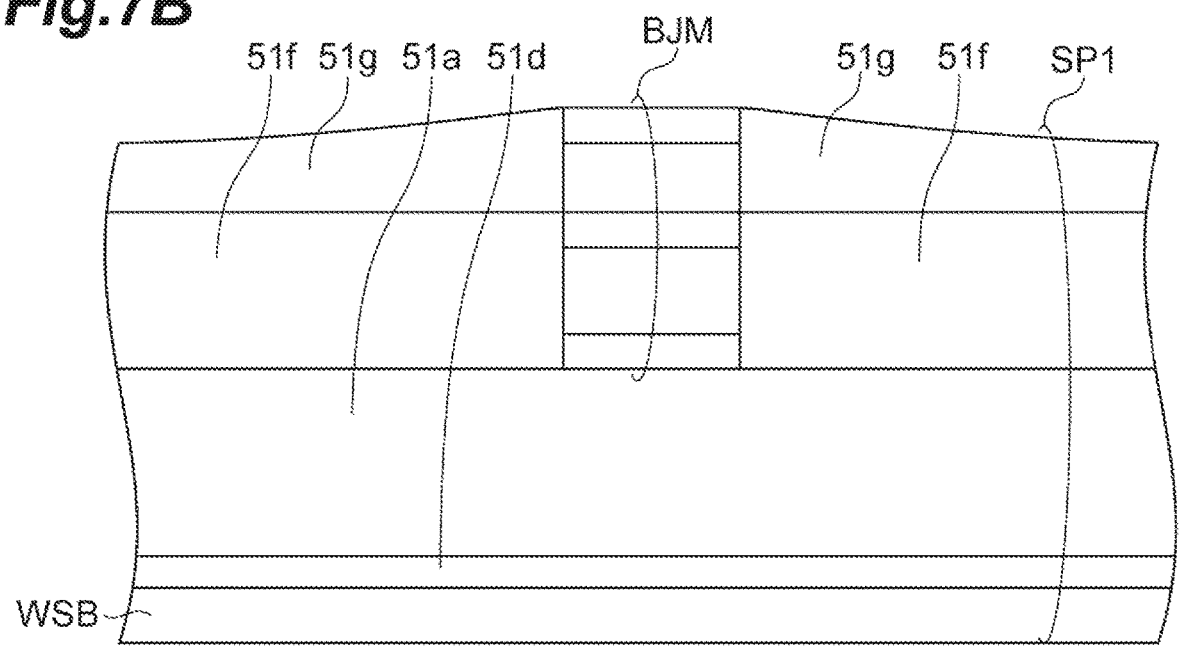
FIG. 7B is a schematic cross-sectional view showing a major step in the method according to the embodiment.

This regrowth is followed by the removal of the mask M0, and as shown in FIG. 7B, to obtain a first substrate product SP1. The first substrate product SP1 is provided with the semiconductor layer 51g and the butt-joint mesa BJM, and has a top face of the butt-joint mesa BJM and a top face of the semiconductor layer 51g, which is located on each side of the butt-joint mesa BJM. The semiconductor layer 51g has a top face that extends outward from the boundaries between the top faces of the semiconductor layer 51g and the butt-joint mesa BJM such that the semiconductor layer 51g and the butt-joint mesa BJM thus arranged form a shallow concave surface. The difference between the top and the bottom of the concave on the surface of the first substrate product SP1 ranges from 50 nm to 300 nm.

Exemplary butt-joint mesa BJM embedded.
Semiconductor layer 51f for the current block region 29: i-type GaInAsP (having a bandgap wavelength of 1.3 micrometers)
Semiconductor layer 51g for the second upper cladding layer 33: i-type InP.

The removal of the mask M0 is followed by the second regrowth of a semiconductor layer 51h for the lower core layer 31 and a semiconductor layer 51i for the lower cladding layer 39. Specifically, as shown in FIG. 8A, the semiconductor layer 51h for the lower core layer 31and the semiconductor layer 51i for the lower cladding layer 39 are grown on the entire surface of the semiconductor substrate WSB (the first substrate product SP1) in the second regrowth to embed the concave surface resulting from the first regrowth, thereby forming a second substrate product SP2 that has a substantially flat epi-surface. The second substrate product SP2 has a surface flatness of 10 nm or less, which is defined as the maximum difference in level of the surface unevenness. In order to obtain good bonding interface with high yield, the surface flatness is preferably 10 nm or less.

Exemplary planarization layer.
Semiconductor layer 51h for the lower core layer 31: Si-doped $n^+$-type GaInAsP (having a bandgap wavelength of 1.3 micrometers) with a thickness of 300 nm.

Semiconductor layer 51i for the lower cladding layer 39: i-type GaInAsP (having a bandgap wavelength of 1.2 micrometers) with a thickness of 100 nm.

The second regrowth is followed by the growth of an insulating layer 53 for the insulating thin film, as shown in FIG. 8B, thereby fabricating a third substrate product SP3. Specifically, a silicon-based inorganic insulating film, such as silicon oxide film, is deposited on the second substrate product.

Exemplary insulating layer 53.

Insulating layer 53: silicon oxide film with a thickness of 10 nm.

Figure 9:
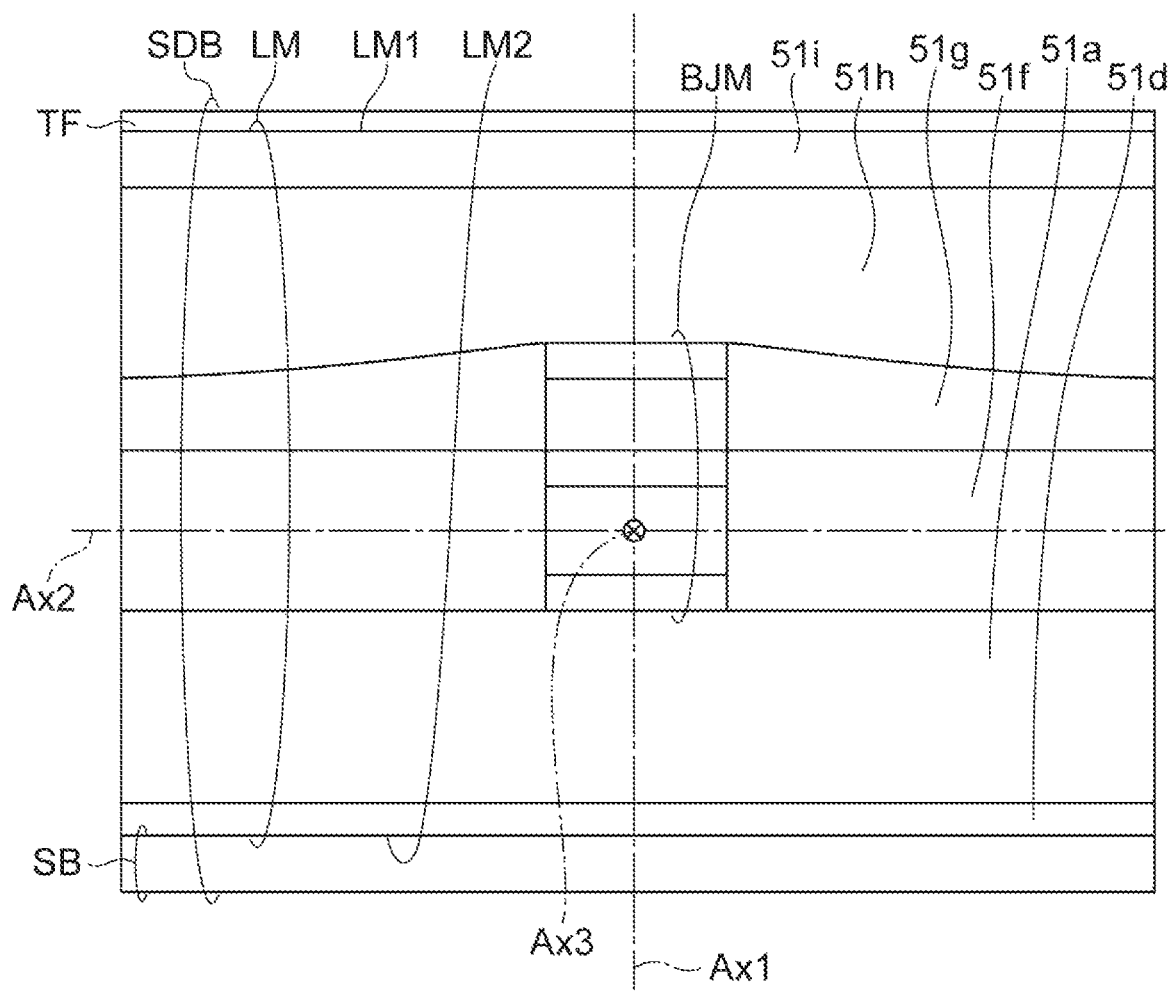
FIG. 9 is a schematic cross-sectional view showing a major step in the method according to the embodiment.

The third substrate product SP3 is separated into the laminate components SBD. Specifically, as illustrated in FIG. 9, the separation of the third substrate product SP3 is performed by cleaving the third substrate product SP3, which is made of III-V semiconductor having a cleavage property. The laminate component SBD has a laminate structure resulting from the epi-structure of the third substrate product SP3. Specifically, the laminate component SBD is provided with the semiconductor laminate LM. The semiconductor laminate LM has a first face LM1 and a second face LM2 opposite to the first face LM1. The first face LM1 is covered with the insulating thin film TF. The laminate component SBD is, for example, 3 mm long and 1.2 mm wide. The method for fabricating the hybrid optical assembly forms the laminate component SBD by epi-growth, photolithography and etching. FIG. 9 shows the orientation of the laminate component SBD by the first, second and third axes Ax1, Ax2 and Ax3 depicted therein.

Figure 5B:
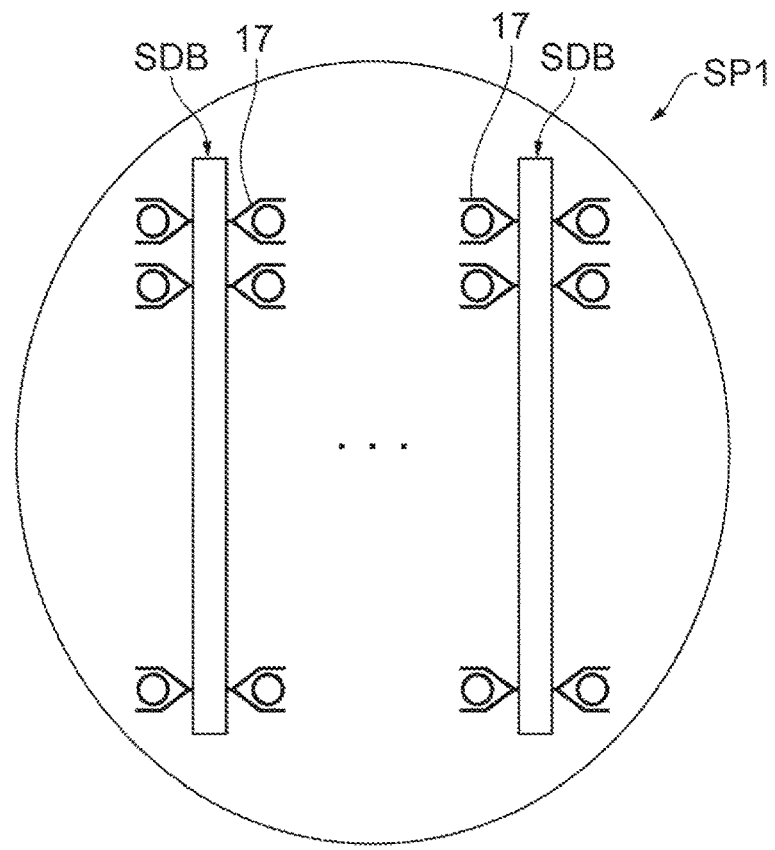
FIG. 5B is a schematic view showing a major step in the method according to the embodiment.
Figure 10:
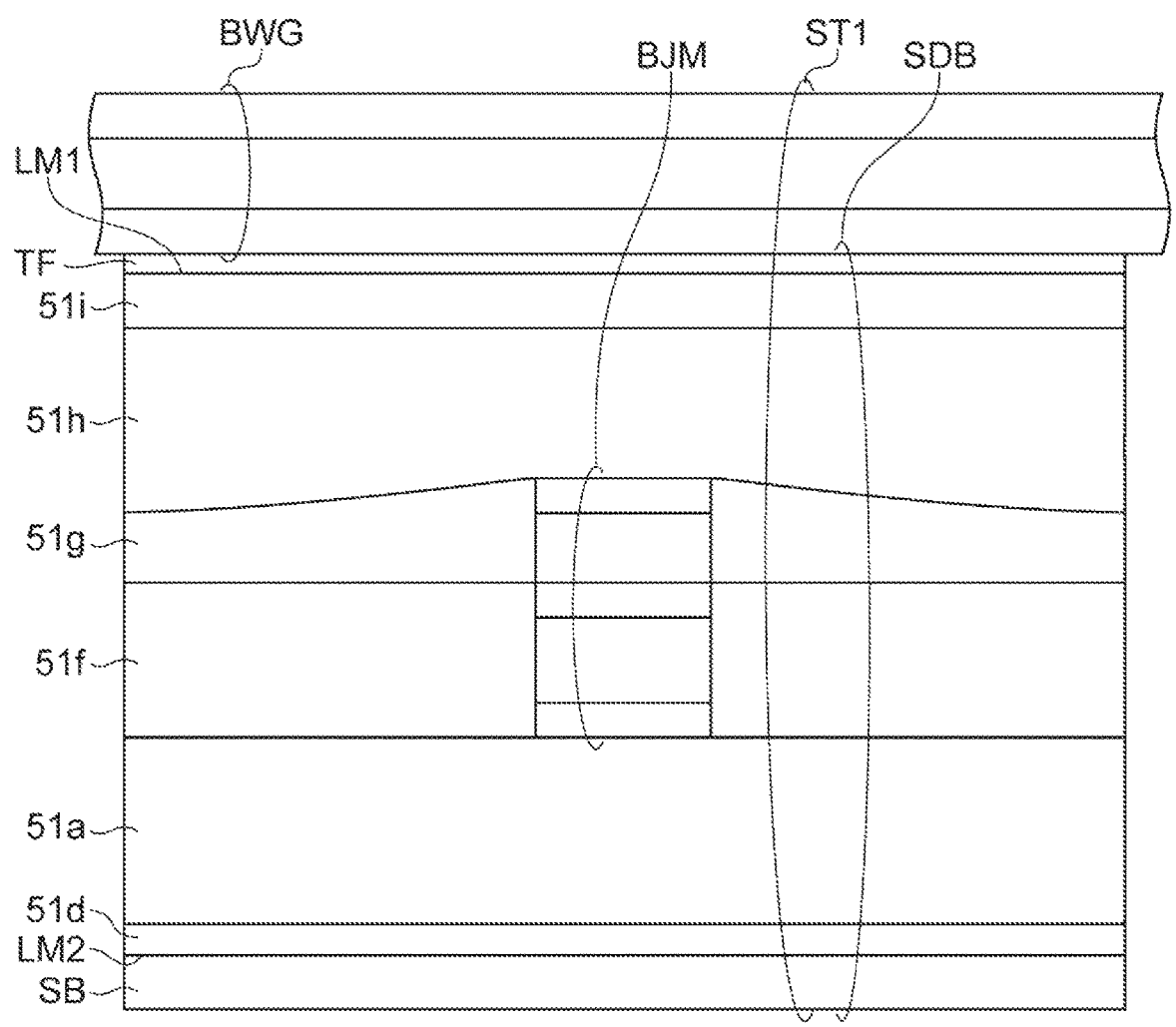
FIG. 10 is a schematic cross-sectional view showing a major step in the method according to the embodiment.

In step S102, the laminate component SDB is bonded to the waveguide substrate BWG. Specifically, as shown in FIG. 5B, the laminate component SDB is placed on the waveguide substrate BWG, specifically positioned to a device section SCT of the waveguide substrate BWG (or the arrangement of the device sections SCT), and then the laminate component SDB is bonded to the waveguide substrate BWG at the insulating thin film TF thereof, as shown in FIG. 10, to form the first laminate product ST1, which may have the arrangement of the multiple laminate components SDB on the waveguide substrate BWG.

Conditions in the bonding process: Activation of the surface by $N_2$ plasma treatment; Cleaning of the surface with ultrasonic water; Preliminary bonding in room temperature atmosphere; and Annealing at 300 degrees Celsius for 2 hours.

Figure 11:
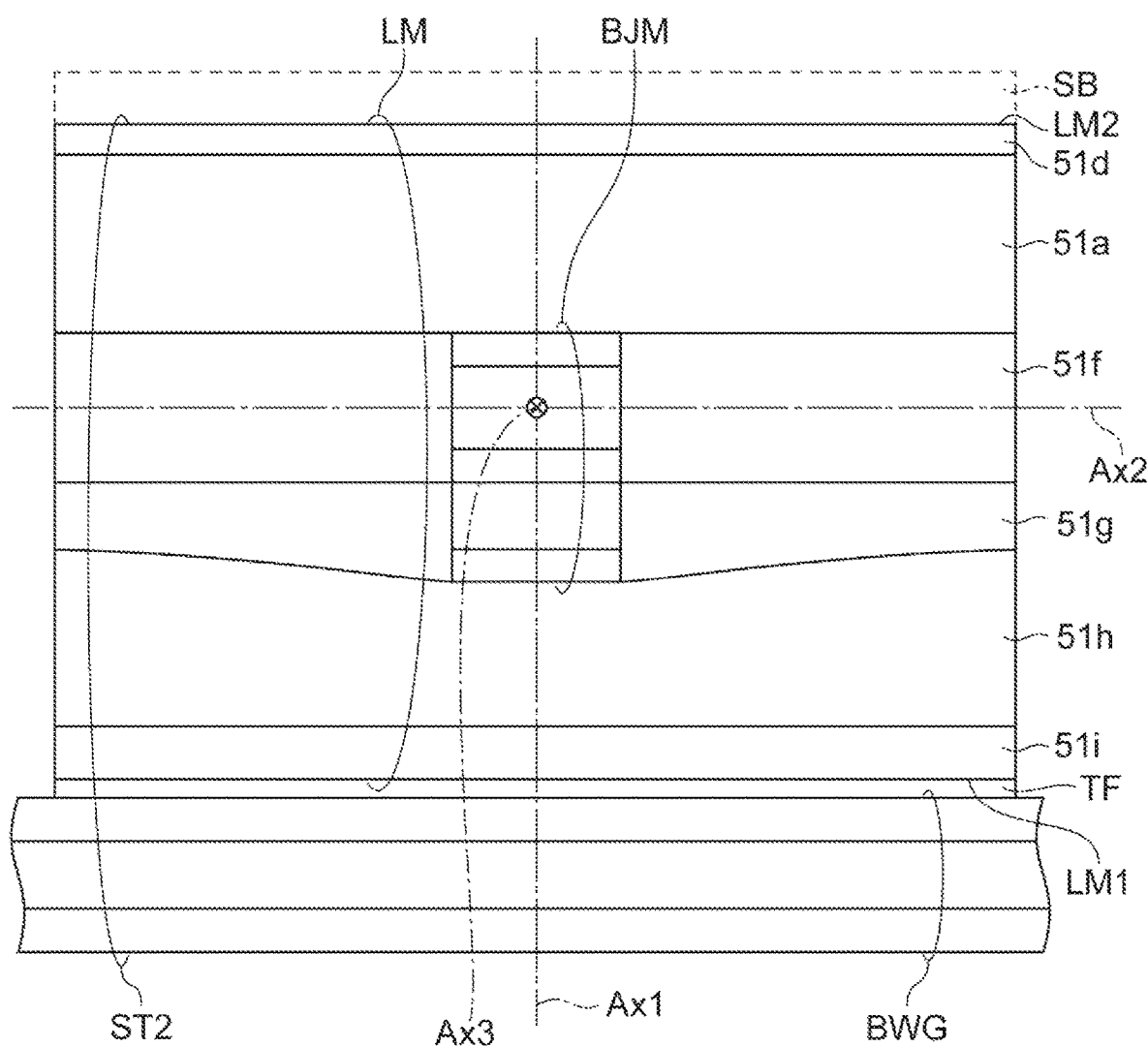
FIG. 11 is a schematic cross-sectional view showing a major step in the method according to the embodiment.

In step S103, the semiconductor substrate SB is removed from the first laminate product ST1. Specifically, as shown in FIG. 11, the semiconductor substrate SB is removed from the first laminate product ST1 to obtain a second laminate product ST2. The first laminate product ST1 is etched to remove the semiconductor substrate SB therefrom, so that the second face LM2 of the semiconductor laminate LM appears in the second laminate product ST2. For example, the application of a wet etching using an etchant, such as hydrochloric acid, can remove the semiconductor substrate SB. This etching exposes a semiconductor layer 51d, which works as the contact layer, at the uppermost layer of the second laminate product ST2.

Figure 12:
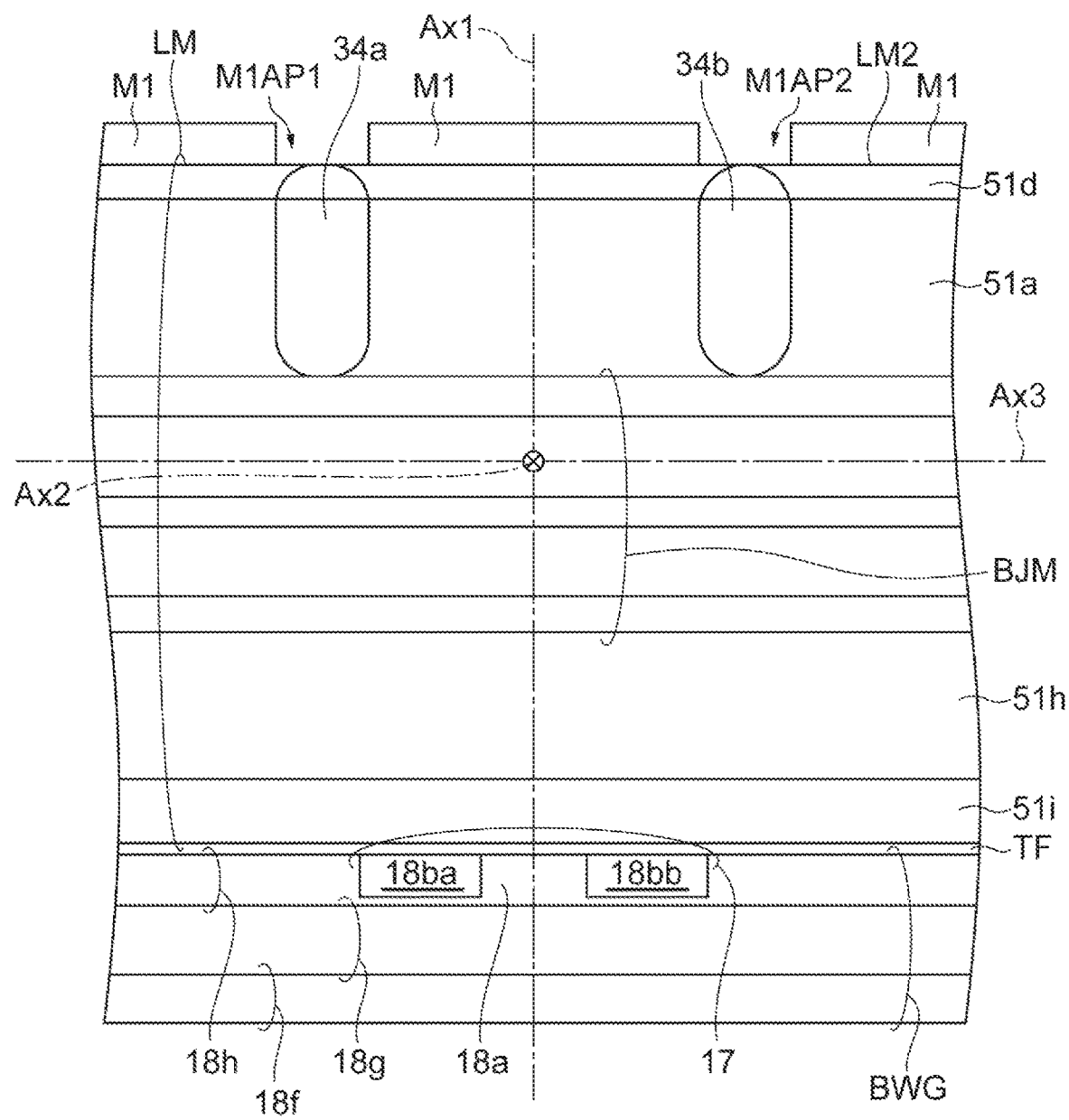
FIG. 12 is a schematic cross-sectional view showing a major step in the method according to the embodiment.
Figure 13:
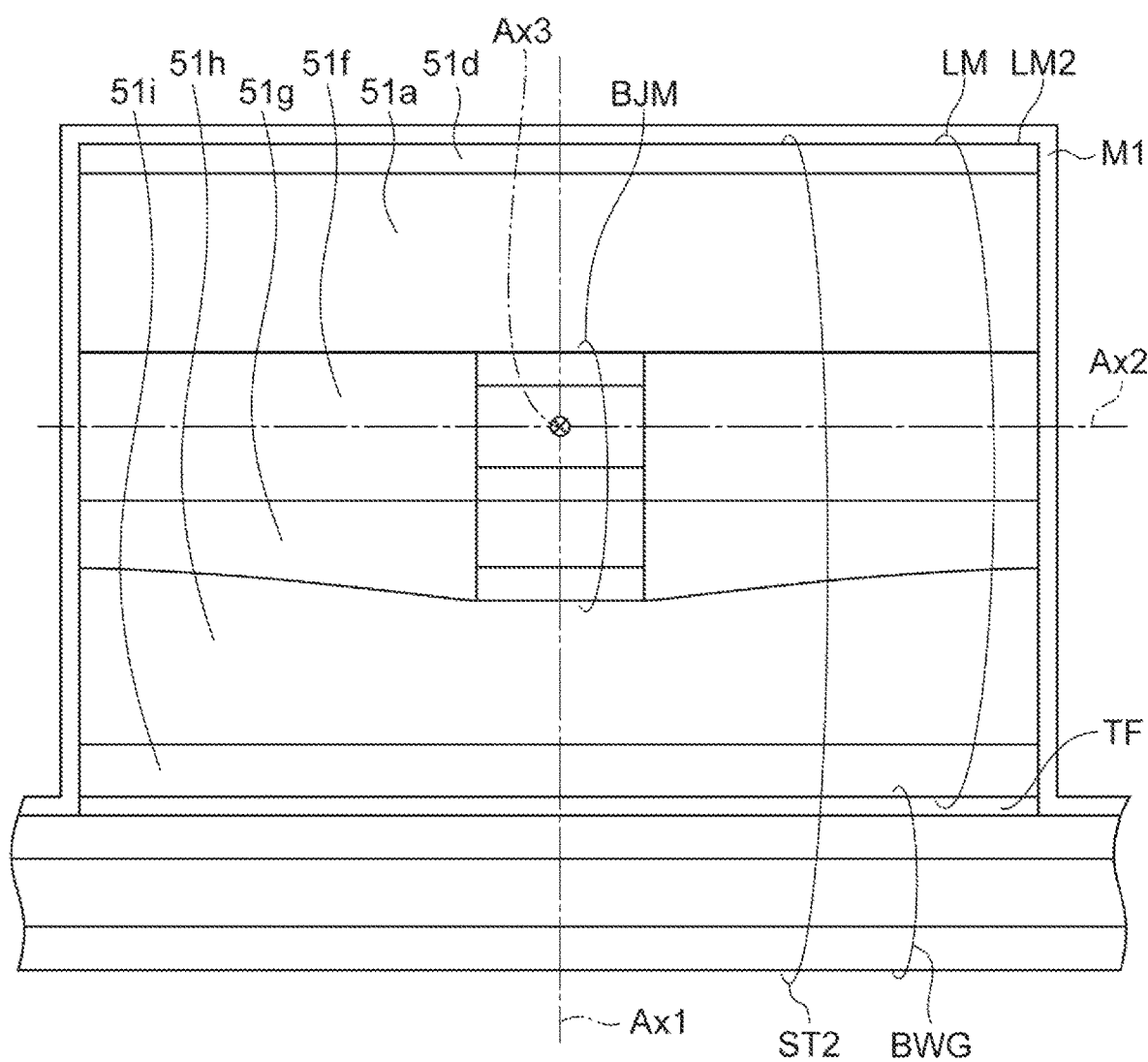
FIG. 13 is a schematic cross-sectional view showing a major step in the method according to the embodiment.

If necessary, in step S104, the semiconductor laminate LM of the second laminate product ST2 is processed to form a high specific resistance region. In the embodiment, the high specific resistance region is formed by ion implantation of proton. Specifically, as shown in FIGS. 12 and 13, a first mask M1 is formed on the second surface LM2 of the semiconductor stack LM. The first mask M1 has a first opening M1AP1 and a second opening M1AP2 which extend in the direction of the second axis Ax2, and the first and second openings M1AP1 and M1AP2 are arranged in the direction of the third axis Ax3. The first mask M1 has a pattern that defines the first and second openings M1AP1 and M1AP2 therebetween. Specifically, the pattern covers the semiconductor laminate LM, which is located on the waveguide structure 17 of the waveguide substrate BWG. The first mask M1 is used to implant proton ions into the semiconductor layer 51a for the first upper cladding layer 25. The proton ion implantation can provide the semiconductor laminate LM with the first and second high specific resistance regions 34a and 34b in each device section SCT. The interval between the first and second high specific resistance regions 34a and 34b may be, for example, 2 micrometers. After the ion implantation, the first mask M1 is removed to obtain the second laminate product ST2. The first mask M1 can be made of, for example, resist.

Figures 14A, 14B:
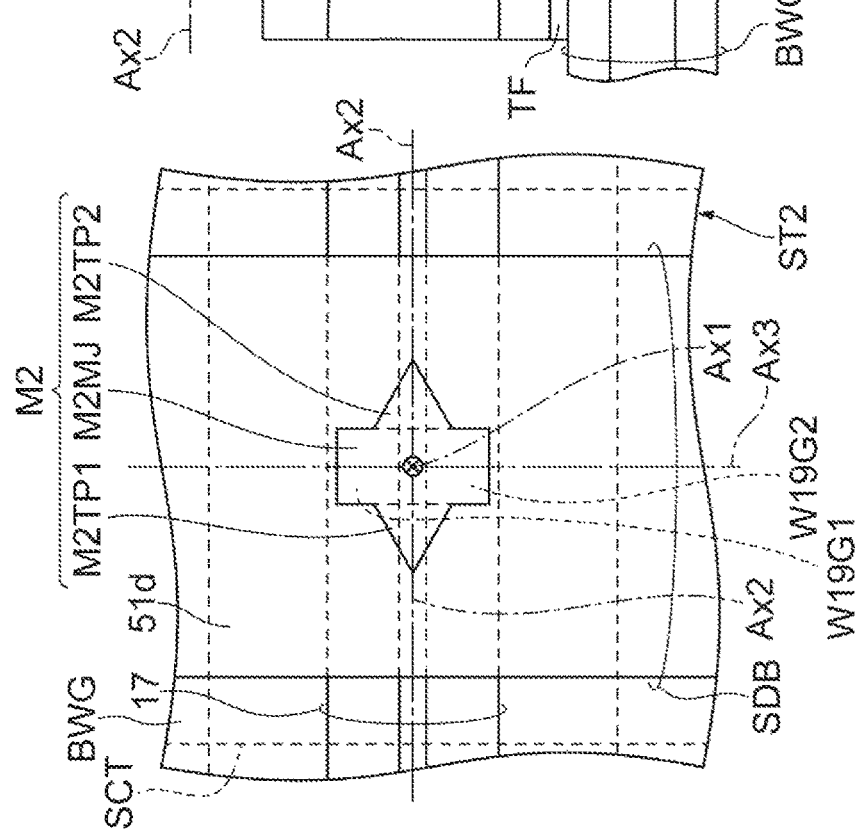
FIG. 14A is a schematic plan view showing a major step in the method according to the embodiment.
FIG. 14B is a schematic cross-sectional view showing a major step in the method according to the embodiment.

The semiconductor substrate SB has been removed, and in step S105, the semiconductor laminate LM is processed to form a first semiconductor mesa. Specifically, as shown in FIGS. 14A and 14B, a second mask M2 is formed on the semiconductor laminate LM of the second laminate product ST2 by photolithography and etching. The second mask M2 includes a silicon-based inorganic insulating film, such as a silicon nitride film. As shown in FIG. 14A, the second mask M2 includes a first tapered portion M2TP1, a second tapered portion M2TP2, and a major portion M2MJ. The first tapered portion M2TP1, the major portion M2MJ and the second tapered portion M2TP2 are arranged on the waveguide structure 17 of the waveguide substrate BWG in the direction of the second axis Ax2.

The semiconductor laminate LM of the second laminate product ST2 is etched with the second mask M2, as shown in FIG. 14B, to form the first semiconductor mesa 19 and the remaining semiconductor laminate LM. This etching process can be performed, for example, by dry etching using an etchant, such as $CH_4$ and $H_2$. After the etching, in the present embodiment, the second mask M2 is left without removal. However, if needed, the second mask M2 may be removed using both dry etching and wet etching.

This etching brings a third laminate product ST3, which is produced from the second laminate product ST2, to completion. The third laminate product ST3 is provided with the first semiconductor mesa 19, which is provided with the contact layer 47, the first upper cladding layer 25 and the upper core layer 23, and the remaining semiconductor laminate LM which includes the semiconductor layers (51g, 51h, and 51i) for the second upper cladding layer 33, the lower core layer 31 and the lower cladding layer 39. The first semiconductor mesa 19 is provided with the first portion 19a, the second portion 19b, and the third portion 19c, which are sequentially arranged in the direction of the second axis Ax2. Specifically, in the first semiconductor mesa 19, the second portion 19b is provided with the first upper cladding layer 25 and the active region 27, and each of the first and third portions 19a and 19c is provided with the first upper cladding layer 25 and the current block region 29. Each of the first and third portions 19a and 19c has a tapered shape, and the second portion 19b has a width larger than the maximum width of the first and third portions 19a and 19c. The wide second portion 19b is disposed between the roots of the first and third portions 19a and 19c, and extends from the roots in the opposite directions on the third axis Ax3 to form wing portions (labelled as "W19G1" and "W19G2" in FIG. 14A). These wing portions each have a width larger than that of each of the first and third portions 19a and 19c. The width of each wing portion is larger than that of the core layer of the waveguide structure 17 and is smaller than the outer width of the cladding layer of the waveguide structure 17.

The first semiconductor mesa 19 has been formed as above, and in step S106, the third laminate product ST3 is processed to form a second semiconductor mesa. Specifically, as shown in FIGS. 15A and 15B, a third mask M3 is formed on the remaining semiconductor laminate LM and the first semiconductor mesa 19 by photolithography and etching. As shown in FIG. 15A, the third mask M3 includes a first tapered portion M3TP1, a second tapered portion M3TP2, and a major portion M3MJ. The first tapered portion M3TP1, the major portion M3MJ and the second tapered portion M3TP2 are arranged on the waveguide structure 17 of the waveguide substrate BWG in the direction of the second axis Ax2. The third mask M3 includes a silicon-based inorganic insulating film, such as a silicon nitride film.

As shown in FIG. 15B, the remaining semiconductor laminate LM of the third laminate product ST3 is etched with the third mask M3 to form the second semiconductor masa 21. This etching process can be performed, for example, by dry etching using an etchant, such as $CH_4$ and $H_2$. After the etching, in the present embodiment, the third mask M3 (along with the second mask M2) is removed using both dry etching and wet etching.

This etching has produced a fourth laminate product ST4 from the third laminate product ST3. The fourth laminate product ST4 is provided with both the first semiconductor mesa 19, which includes the contact layer 47, the first upper cladding layer 25 and the upper core layer 23, and the second semiconductor mesa 21, which includes the second upper cladding layer 33, the lower core layer 31 and the lower cladding layer 39.

The second semiconductor mesa 21 includes a first portion 21a, a second portion 21b, and a third portion 21c, which are sequentially arranged in the direction of the second axis Ax2. Specifically, in the second semiconductor mesa 21, the second portion 21b is provided with the second upper cladding layer 33, the lower core layer 31, and the lower cladding layer 39. Each of the first and second portions 21a and 21c has a tapered shape. The second portion 21b has a width larger than the maximum width of each of the first and third portions 21a and 21c, and the wide second portion 21b is disposed between the roots of the first and third portions 21a and 21c and extends therefrom in the opposite directions on the third axis Ax3 to form wing portions (labelled as "W21G1" and "W21G2" in FIG. 15B). These wing portions each have a width larger than that of each of the first and third portions 21a and 21c. The width of each wing portion is larger than that of the core layer of the waveguide structure 17 and larger than the outer width of the cladding layer of the waveguide structure 17. The width of the wing portion of the second semiconductor mesa 21 is larger than that of the wing portion of the first semiconductor mesa 19. The first and third portions 21a and 21c of the second semiconductor mesa 21 have respective lengths larger than those of the first and third portions 19a and 19c of the first semiconductor mesa 19 in the direction of the second axis Ax2.

The second semiconductor mesa 21 has been formed as above, and then, if necessary, in step S107, as shown in FIGS. 16A and 16B, the fourth laminate product ST4 is processed to form a contact opening in the second semiconductor mesa 21. Specifically, as shown in FIG. 16A, a fourth mask M4 is formed on the fourth laminate product ST4 by photolithography. The fourth mask M4 covers the first semiconductor mesa 19 and has an opening M4AP, which is positioned on the upper face of the second semiconductor mesa 21. The second upper cladding layer 33 of the second semiconductor mesa 21 is etched with the fourth mask M4 to form the opening 33AP in the second upper cladding layer 33. This etching may include wet etching using an etchant, such as an HCl solution. The opening 33AP reaches the lower core layer 31 to expose the lower core layer 31. The exposure of the lower core layer 31 at the opening 33AP allows the thick core lower core layer 31 to act as a contact layer in addition to a low resistance current path. After the etching, the fourth mask M4 is removed to obtain a fifth laminate product ST5, as shown in FIG. 16B.

Figure 17A:
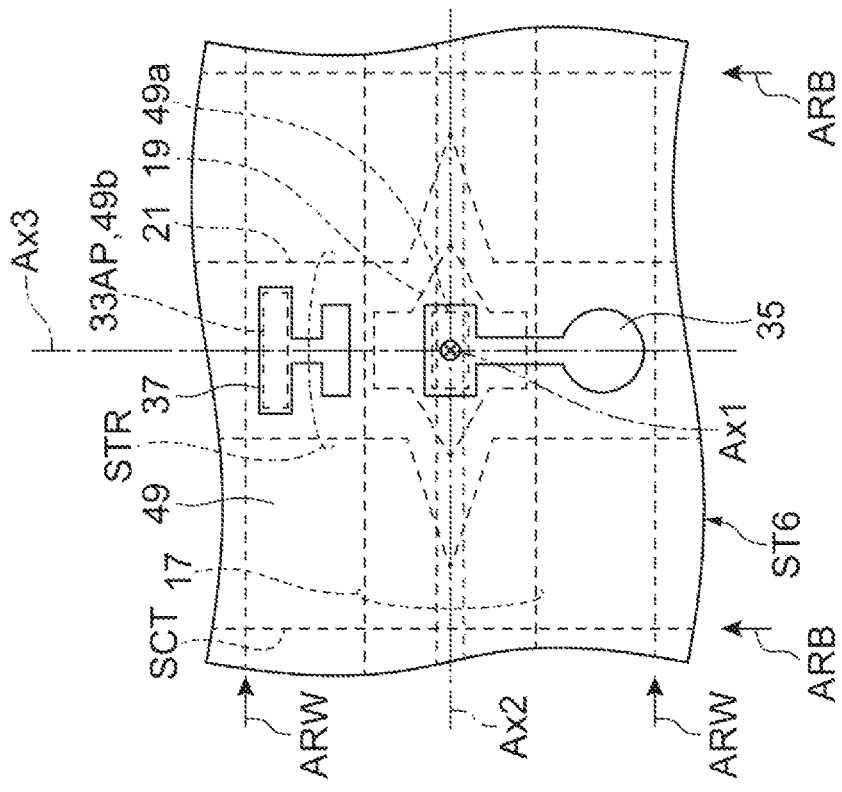
FIG. 17A is a schematic plan view showing a major step in the method according to the embodiment.

The second semiconductor mesa 21 has been formed as above, and in step S108, as shown in FIG. 17A, an insulating film 49 is formed on the fifth laminate product ST5 by vapor deposition, photolithography and etching. Specifically, the insulating film 49 is formed on the first and second semiconductor mesas 19 and 21 and the waveguide substrate BWG, and has a first opening 49a and a second opening 49b, which are located on the first and second semiconductor mesas 19 and 21, respectively. Specifically, the first opening 49a is located on the active region 27 of the first semiconductor mesa 19, and the second opening 49b is located at the opening 33AP of the second upper cladding layer 33.

Exemplary insulating film 49: silicon nitride film having a thickness of 500 nm.

Figure 17B:
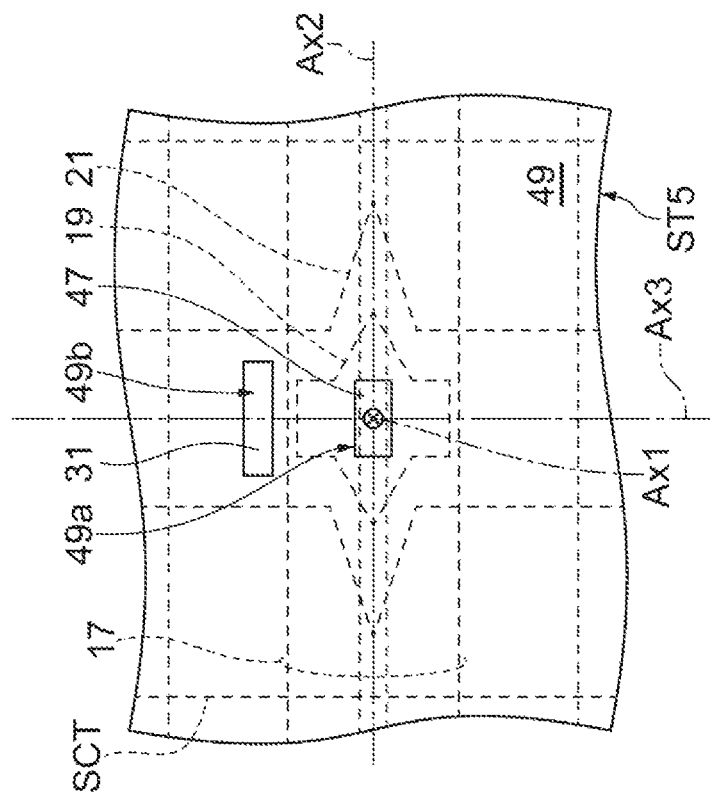
FIG. 17B is a schematic plan view showing a major step in the method according to the embodiment.

The second semiconductor mesa 21 has been formed as above, and then in step S109, as shown in FIG. 17B, electrodes are formed on the fifth laminate product ST5 to obtain a sixth laminate product ST6. Specifically, the first and second electrodes 35 and 37 are formed on the first and second semiconductor mesas 19 and 21, respectively. The first and second electrodes 35 and 37 are connected to the first and second semiconductor mesas 19 and 21, respectively. In detail, the first electrode 35 makes contact with the upper face of the first semiconductor mesa 19. The second electrode 37 makes contact with the second semiconductor mesa 21. The second upper cladding layer 33 in the second semiconductor mesa 21 has an opening 33AP to the lower core layer 31, and the second electrode 37 is connected through the opening 33AP of the second upper cladding layer 33 with the top face of the lower core layer 31.

Exemplary electrodes.
First electrode 35 (p-side electrode): Ti/Pt/Au.
Second electrode 37 (n-side electrode): AuGeNi.

As seen from the description, the sixth laminate product ST6 is provided with the semiconductor structure STR, the waveguide substrate BWG, and the insulating film 49, which covers the waveguide substrate BWG and the first and second electrode 35 and 37, which are disposed on the semiconductor structure STR. The semiconductor structure STR includes an array of first semiconductor mesas 19 and an array of second semiconductor mesas 21, which are produced from the laminate parts SDB that have been bonded to the waveguide substrate BWG, and the first semiconductor mesas 19 are disposed on the respective second semiconductor mesas 21. The sixth laminate product ST6, specifically, both the arrangement of the waveguide substrate BWG and the second semiconductor mesas 21 are separated into pieces by breaking the sixth laminate product ST6 along a line (indicated by Arrow ARW) which defines the boundary between the adjacent first semiconductor mesas 19, and the sixth laminate product ST6, specifically the waveguide substrate BWG, is separated into pieces by breaking it along a line (indicated by Arrow ARB) which defines the boundary between the adjacent semiconductor structures STR. The two breaking processes can form the hybrid optical assembly 11. The breaking processes each include, for example, dicing. If necessary, the hybrid optical assembly 11 may be provided with an AR coating on the end face of the photonic device 13 thereof.

The method for fabricating the hybrid optical assembly 11 includes bonding the laminate component SDB with the waveguide substrate BWG through the insulating thin film TF thereof to form a laminate product, and then producing the first and second semiconductor mesas 19 and 21 from the laminate product by photolithography and etching. In the method, aligning the laminate component SDB with the waveguide substrate BWG can form optical coupling therebetween, and processing the laminate product using photolithography and etching can form optical coupling between the semiconductor mesas (19 and 21).

The present embodiment can provide a hybrid optical assembly having a structure allowing the improvement of electrical resistance in a light source device, and also can provide a method for fabricating the hybrid optical assembly.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A hybrid optical assembly comprising:
a photonic device having a waveguide structure, the waveguide structure including group IV semiconductor and oxide; and
an optical source device being bonded to the photonic device,
the optical source device having a first semiconductor mesa and a second semiconductor mesa,
the optical source device and the waveguide structure of the photonic device being arranged in a direction of a first axis,
the first semiconductor mesa and the second semiconductor mesa extending in a direction of a second axis intersecting the first axis,
the second semiconductor mesa having a length larger than that of the first semiconductor mesa,
the first semiconductor mesa including an upper core layer and a first upper cladding layer,
the upper core layer including group III-V semiconductor,
the first upper cladding layer including group III-V semiconductor of a first conductivity-type,
the upper core layer including an active region,
the second semiconductor mesa including an lower core layer and a second upper cladding layer,
the lower core layer including group III-V semiconductor of a second conductivity-type opposite to the first conductivity-type,
the second upper cladding layer including group III-V semiconductor,
the photonic device, the lower core layer, the second upper cladding layer, the upper core layer, and the first upper cladding layer being arranged sequentially in the direction of the first axis.

2. The hybrid optical assembly according to claim 1, wherein
the second semiconductor mesa further includes a lower cladding layer,
the lower cladding layer is disposed between the lower core layer and the waveguide structure, and
the lower cladding layer of the second semiconductor mesa has a thickness smaller than that of the second upper cladding layer.

3. The hybrid optical assembly according to claim 1, wherein
the photonic device has a first ring resonator and a second ring resonator, and
the waveguide structure couples the first ring resonator to the second ring resonator.

4. A method for fabricating a hybrid optical assembly comprising:
preparing laminate components, each of the laminate components having an insulating thin film, a semiconductor laminate and a semiconductor base mounting the semiconductor laminate, the insulating thin film being disposed on a first face of the semiconductor laminate, and the semiconductor laminate including semiconductor layers for a first upper cladding layer, an upper core layer, a second upper cladding layer, and a lower core layer, the semiconductor layers being sequentially arranged on a principal surface of the semiconductor base;
preparing a waveguide substrate having an array of device sections, each of the device sections having a waveguide structure, and the waveguide structure including oxide and group IV semiconductor;
bonding the laminate components to the device sections of the waveguide substrate to form a laminate product including the waveguide structure and the laminate components;
removing the semiconductor base from the laminate product so as to expose a second face of the semiconductor laminate, the second face being opposite to the first face;
after removing the semiconductor base, processing the semiconductor laminate to form a first semiconductor mesa including the upper core layer and the first upper cladding layer, the upper core layer including an active region; and
after forming the first semiconductor mesa, processing the semiconductor laminate to form a second semiconductor mesa including the lower core layer and the second upper cladding layer.

5. The method according to claim 4, further comprising:
etching the second upper cladding layer of the second semiconductor mesa to form an opening in the second upper cladding layer, the opening reaching the lower core layer;
forming an insulating film on the first semiconductor mesa, the second semiconductor mesa, and the waveguide substrate, the insulating film having a first opening on the first semiconductor mesa and a second opening on the second semiconductor mesa; and
forming a first electrode and a second electrode, the first electrode and the second electrode being connected to the first semiconductor mesa and the second semiconductor mesa through the first opening and the second opening of the insulating film, respectively,
wherein the first opening of the insulating film is disposed on the opening of the second upper cladding layer.

6. The method according to claim 4, wherein
preparing the laminate components includes:
growing the semiconductor laminate on the semiconductor base to form an epitaxial substrate,
forming a mask on the epitaxial substrate, etching the epitaxial substrate with the mask to form a butt-joint mesa, the butt-joint mesa including the semiconductor layers for the first upper cladding layer and the active region, growing a semiconductor layer for a current blocking region with the mask to embed the butt-joint mesa, after growing the semiconductor layer for the current blocking region with the mask, depositing an inorganic insulating layer for the insulating thin film to form a substrate product, and separating the substrate product into the laminate components.

* * * * *